United States Patent
Sasaki et al.

(10) Patent No.: US 8,482,105 B2
(45) Date of Patent: Jul. 9, 2013

(54) SEMICONDUCTOR SUBSTRATE, LAMINATED CHIP PACKAGE, SEMICONDUCTOR PLATE AND METHOD OF MANUFACTURING THE SAME

(75) Inventors: Yoshitaka Sasaki, Milpitas, CA (US); Hiroyuki Ito, Milpitas, CA (US); Atsushi Iijima, Hong Kong (CN)

(73) Assignees: Headway Technologies, Inc., Milpitas, CA (US); Sae Magnetics (H.K.) Ltd., Hong Kong (CN)

( * ) Notice: Subject to any disclaimer, the term of this patent is extended or adjusted under 35 U.S.C. 154(b) by 667 days.

(21) Appl. No.: 12/656,458

(22) Filed: Jan. 29, 2010

(65) Prior Publication Data
US 2011/0186985 A1  Aug. 4, 2011

(51) Int. Cl.
*H01L 29/06* (2006.01)
*H01L 21/76* (2006.01)

(52) U.S. Cl.
USPC .......... 257/622; 257/626; 257/797; 438/401; 438/424

(58) Field of Classification Search
USPC .. 257/622, 626, 797, 210, 211, 620; 438/401, 438/424, 462
See application file for complete search history.

(56) References Cited

U.S. PATENT DOCUMENTS

| | | | |
|---|---|---|---|
| 5,266,528 A * | 11/1993 | Yamada | 83/49 |
| 5,953,588 A | 9/1999 | Camien et al. | |
| 7,101,735 B2 * | 9/2006 | Noma et al. | 438/114 |
| 7,127,807 B2 | 10/2006 | Yamaguchi et al. | |
| 7,371,613 B2 * | 5/2008 | Shimanuki | 438/113 |
| 8,298,963 B2 * | 10/2012 | Akiba et al. | 438/773 |
| 2005/0127512 A1 * | 6/2005 | Yamagata | 257/758 |
| 2011/0031615 A1 * | 2/2011 | Inomata | 257/737 |

OTHER PUBLICATIONS

Gann, "Neo-Stacking Technology," 1999, HDI Magazine, Miller Freeman, Inc.

* cited by examiner

*Primary Examiner* — S. V. Clark
(74) *Attorney, Agent, or Firm* — Oliff & Berridge, PLC

(57) ABSTRACT

A semiconductor substrate has a plurality of groove portions formed along scribe lines. The semiconductor substrate includes: a unit region in contact with at least any one of the plurality of groove portions; and a wiring electrode with a portion thereof arranged within the unit region. Further, the plurality of groove portions have a wide-port structure in which a wide width portion wider in width than a groove lower portion including a bottom portion is formed at an inlet port thereof.

9 Claims, 35 Drawing Sheets

(A)

(B)

(A)

(B)

SEMICONDUCTOR SUBSTRATE, LAMINATED CHIP PACKAGE, SEMICONDUCTOR PLATE AND METHOD OF MANUFACTURING THE SAME

BACKGROUND

1. Field of the Invention

The present invention relates to a semiconductor substrate for manufacturing a laminated chip package including a plurality of laminated chips, a laminated chip package, a semiconductor plate, and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of chips has received attention recently. Known as such a SIP is a package having a plurality of laminated chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of chips on a substrate and connecting a plurality of electrodes formed on each of the chips and external connecting terminals formed on the substrate by wire bonding. The through electrode system is a system of forming a plurality of through electrodes in each of the laminated chips and realizing wiring between the chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the chips.

Conventionally known methods of manufacturing the laminated chip package are those disclosed, for example, in U.S. Pat. Nos. 5,953,588 and 7,127,807 B2, for example. In U.S. Pat. No. 5,953,588, the following manufacturing method is described. In this manufacturing method, first, a plurality of chips cut out of a wafer are embedded in an embedding resin. Then, a plurality of leads to be connected to the chips are formed to create a structure called Neo-Wafer. Subsequently, the Neo-Wafer is cut to create a plurality of structures called Neo-chips each including the chip, the resin surrounding the chip, and the plurality of leads. In this event, end faces of the plurality of leads connected to the chips are exposed on side surfaces of the Neo-chips. Then, a plurality of kinds of Neo-chips are laminated to create a laminated body. In this laminated body, the end faces of the plurality of leads connected to the chips at the respective layers are exposed on the same side surface of the laminated body.

Keith D. Gann, "Neo-Stacking Technology", HDI Magazine, December, 1999 describes that a laminated body is formed by the same method as the manufacturing method described in U.S. Pat. No. 5,953,588 and wiring is formed on two side surfaces of the laminated body.

On the other hand, U.S. Pat. No. 7,127,807 B2 discloses a multilayer module which is configured by laminating a plurality of active layers made by forming one or more electronic elements and a plurality of conductive traces on a flexible polymer substrate.

SUMMARY OF THE INVENTION

Incidentally, the laminated chip package is manufactured by the following procedure. First, a wafer (a device wafer) having a plurality of devices formed therein is created by performing wafer process. Then, a plurality of groove portions along scribe lines are formed in the device wafer. Further, a resin such as an epoxy resin, a polyimide resin or the like is embedded in the groove portions to form insulating layers to thereby create a grooved device wafer. Such grooved device wafers are bonded together with an insulating adhesive to create a laminated device wafer. The laminated device wafer is cut along the groove portions to manufacture laminated chip packages.

Meanwhile, in the laminated chip package, a plurality of device plates are stacked one on the other. When the laminated device wafer is cut along the groove portions, the grooved device wafers are also cut along the groove portions. Members in a plate shape formed by cutting the grooved device wafer along the groove portions are the device plates.

When manufacturing the laminated chip package, a plurality of groove portions along the scribe lines are formed in the device wafer and then the groove portions is filled with a resin, whereby an insulating layer is formed as described above.

However, a liquid resin has been applied on the surface of the device wafer when filling the groove portions with the resin, but the resin has not entered the inside of the groove portions in some cases. Especially when the depth of the groove portions is made deep or the width of the groove portions is made narrow, the resin has sometimes rarely entered the inside of the groove portions.

On the other hand, a plurality of devices have been created in the device wafer, and wirings to be connected to the devices are formed after the insulating layer is formed.

However, since the wirings to be connected to the devices are formed also on the upper side of the groove portions, there has been a possibility that when a portion not filled with the resin (referred also to as an unfilled portion or an air gap) has appeared in the groove portions, the wirings connected to the devices could be deformed or the like due to depression of the surface of the insulating layer when the grooved device wafers were laminated. Such a situation might make unreliable electrical connection between the device plates in the laminated chip package, failing to enhance the reliability of electrical connection of the laminated chip package.

The present invention is made to solve the above problem, and it is an object to provide a semiconductor substrate including a structure which capable of enhancing the reliability of electrical connection of a laminated chip package, a laminated chip package and a semiconductor plate using the semiconductor substrate, and a method of manufacturing the same.

To solve the above problem, the present invention is a semiconductor substrate having a plurality of groove portions formed along scribe lines, including: a unit region in contact with at least any one of the plurality of groove portions; and a wiring electrode with a portion thereof arranged within the unit region, the plurality of groove portions have a wide-port structure in which a wide width portion wider in width than a groove lower portion including a bottom portion is formed at an inlet port thereof.

In the semiconductor substrate, each of the groove portions has the wide-port structure, so that the resin easily enters the inside of the groove portions and less causes the unfilled portion inside the groove portions.

In the above-described semiconductor substrate, it is preferable that the plurality of groove portions have the wide width portions formed in the entire length direction of the inlet ports thereof.

By forming the wide width portions in the entire length direction of the inlet ports, the resin more easily enters the inside of the plurality of groove portions in the entire length direction and less causes the unfilled portion.

Further, in the above-described semiconductor substrate, it is preferable that the above-described semiconductor substrate has an insulating layer formed by filling the plurality of groove portions with a resin with no space, the insulating layer has a double-layer structure in which a lower insulating layer formed inside of the groove lower portion and an upper insulating layer formed inside of the wide width portion are laminated, and the lower insulating layer is formed using a low-viscosity resin lower in viscosity than the resin forming the upper insulating layer.

In this semiconductor substrate, the unfilled portion more hardly occurs inside the groove portion owing to the formation of the lower insulating layer using the low-viscosity resin inside the groove lower portion which the resin relatively hardly enters.

Further, in the above-described semiconductor substrate, it is preferable that the unit region is formed as a device region having a semiconductor device, the semiconductor substrate further includes a surface insulating layer formed to cover the device region and constituting a surface layer of the semiconductor substrate, and the surface insulating layer is formed using the same resin as the resin of the upper insulating layer in one body without joint.

Such a semiconductor substrate can be easily manufactured since the upper insulating layer and the surface insulating layer can be formed using the same resin in the same one step.

Further, the wiring electrode has an extended terminal portion extended from the unit region to an inside of the groove portion.

Further, the wiring electrode has an extended terminal portion extended from the device region to an inside of the groove portion, and is formed in a protruding shape rising above a surface of the surface insulating layer.

Further, the wiring electrode has a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

Further, it is preferable that the above-described semiconductor substrate has a connecting pad connected to the semiconductor device; and a protecting insulating layer having a connecting hole formed at a position for forming the connecting pad, the protecting insulating layer being disposed under the surface insulating layer and formed to cover the device region, the wiring electrode has an electrode pad having an expanded height from a side outer than the surface of the surface insulating layer to the connecting pad.

Further, the present invention provides a laminated chip package in which a plurality of semiconductor plates including a first semiconductor plate having a first semiconductor device formed therein and a second semiconductor plate having a second semiconductor device formed therein are laminated, entire side surfaces of the first semiconductor plate and the second semiconductor plate are covered with a first insulating layer and a second insulating layer respectively, each of the first insulating layer and the second insulating layer has a double-layer structure in which an upper insulating layer is laminated on a lower insulating layer, and the second semiconductor plate is laminated under the first semiconductor plate.

In this laminated chip package, it is possible that both of the lower insulating layer and the upper insulating layer are formed using resins, and the lower insulating layer is formed using a low-viscosity resin lower in viscosity than the resin forming the upper insulating layer.

Further, the upper insulating layer can be structured to have a depth larger than a depth of the lower insulating layer.

Further, it is possible that the first semiconductor plate further includes a first surface insulating layer formed to cover the first semiconductor device and constituting a surface layer of the laminated chip package, and the first surface insulating layer is formed using the same resin as the resin of the upper insulating layer in one body without joint.

Further, it is possible that a first wiring electrode connected to the first semiconductor device and formed in a protruding shape rising above a surface of the first surface insulating layer.

Further, the present invention provides a semiconductor plate having a semiconductor device formed therein, an entire side surface thereof is covered with an insulating layer, and the insulating layer has a double-layer structure in which an upper insulating layer is laminated on a lower insulating layer.

In the above-described semiconductor plate, it is preferable that both of the lower insulating layer and the upper insulating layer are formed using resins, and the lower insulating layer is formed using a low-viscosity resin lower in viscosity than the resin of the upper insulating layer.

The upper insulating layer can be structured to have a depth larger than a depth of the lower insulating layer.

Further, it is possible that a surface insulating layer formed to cover the semiconductor device and constituting a surface layer of the semiconductor plate, and the surface insulating layer is formed using the same resin as the resin of the upper insulating layer in one body without joint.

Further, the present invention provides a method of manufacturing a semiconductor substrate, including the step of: for an unprocessed substrate having a semiconductor device formed therein, a first groove portion forming step of forming, along scribe lines, a plurality of first groove portions having a first width and a first depth; a second groove portion forming step of forming, at inlet ports of the plurality of first groove portions, second groove portions having a second width wider than the first width and a second depth shallower than the first depth; an insulating layer forming step of applying a resin to a surface on a side where the first groove portions and the second groove portions are formed, to form an insulating layer inside the first groove portions and the second groove portions; and a wiring electrode forming step of forming a wiring electrode to be connected to the semiconductor device after the formation of the insulating layer.

In the manufacturing method, it is preferable that in the insulating layer forming step, prior to the application of the resin, a low-viscosity resin lower in viscosity than the resin is applied to the surface to form a lower insulating layer inside the first groove portions.

It is preferable that in the insulating layer forming step, a surface insulating layer is formed using the resin on the surface on the side where the first groove portions and the second groove portions are formed, and wherein in the wiring electrode forming step, the wiring electrode is formed in a protruding shape rising above a surface of the surface insulating layer.

Further, it is preferable that in the wiring electrode forming step, an extended terminal portion extended from a device region in contact with at least any one of the plurality of first groove portions to the first groove portion is formed in a protruding shape rising above the surface of the surface insulating layer.

Further, the present invention provides a method of manufacturing a laminated chip package, including the steps of: laminating at least two semiconductor substrates manufactured by the manufacturing method according to claim 21 to form a laminated device wafer; making sections of insulating layers each in a double-layer structure including the lower insulating layer, and end faces of the wiring electrodes formed in the semiconductor substrates appear in a cut surface when the laminated device wafer is cut along the first groove portions, to manufacture a device block; and forming, on the cut surface of the device block, a connection electrode connecting the end faces of the wiring electrodes.

It is preferable that when manufacturing the device block, the end faces of the wiring electrodes are made to appear as projecting end faces projecting outward from the surface of the surface insulating layer.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

In the following, embodiments of the present invention will be described with reference to the drawings. Note that the same components will be referred to with the same numerals or letters, while omitting their overlapping descriptions.

First Embodiment

Structures of Semiconductor Wafer

To begin with, the structure of a semiconductor wafer 1 that is an example of a semiconductor substrate according to embodiments of the present invention will be described with reference to FIG. 1 to FIG. 3, FIG. 5 to FIG. 6.

Figure 1:
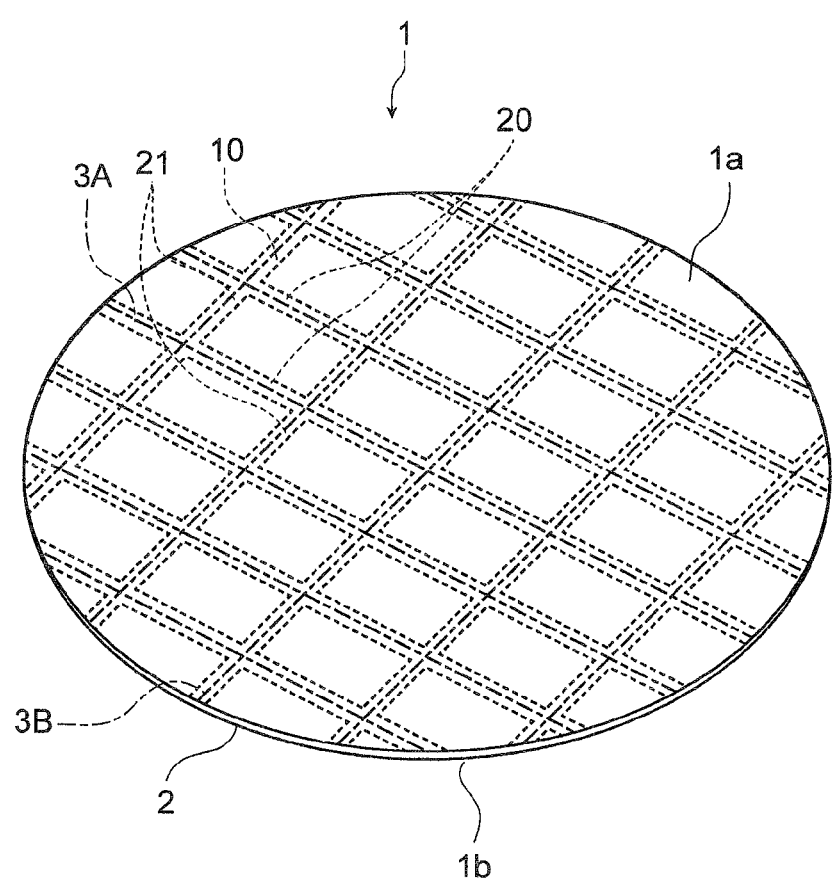
FIG. 1 is a perspective view illustrating the entire semiconductor wafer according to a first embodiment of the present invention.
Figure 2:
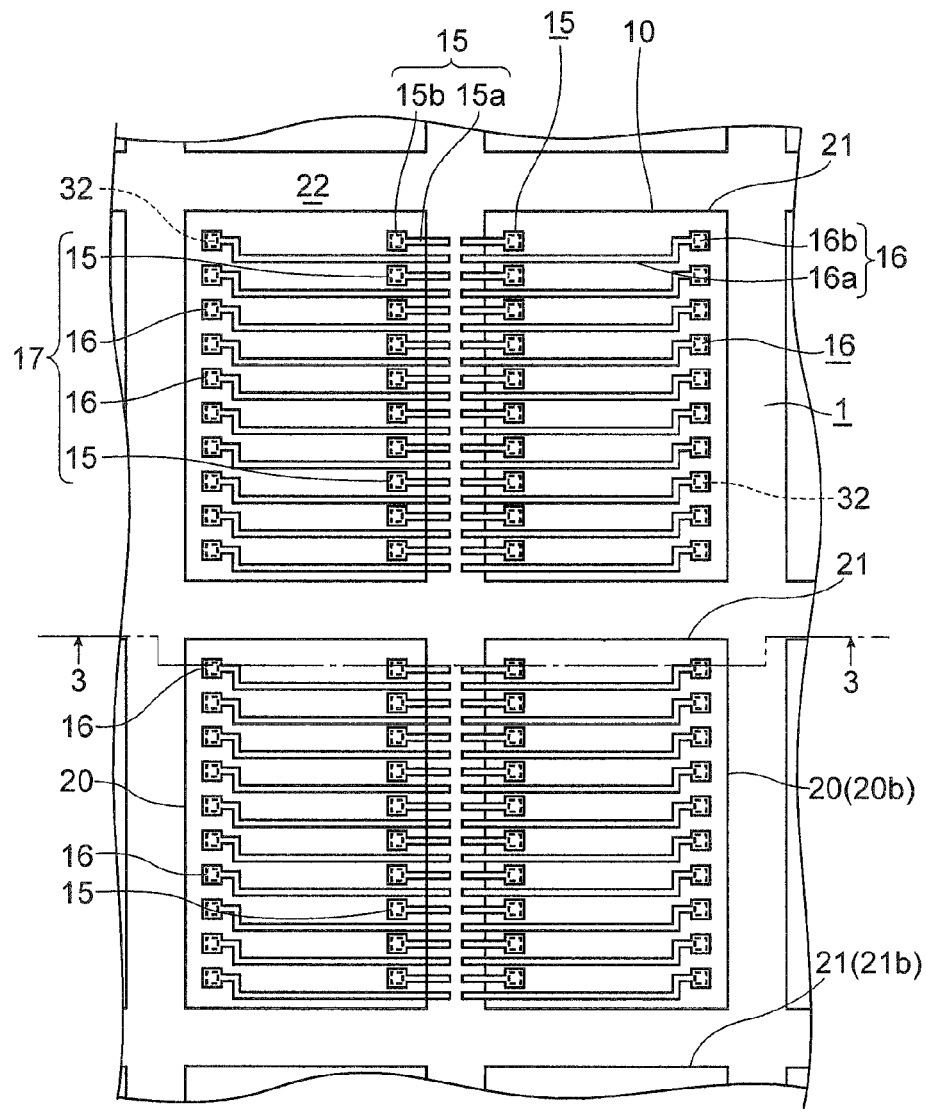
FIG. 2 is a plan view illustrating a device region and a region surrounding it formed in the semiconductor wafer.
Figure 3:
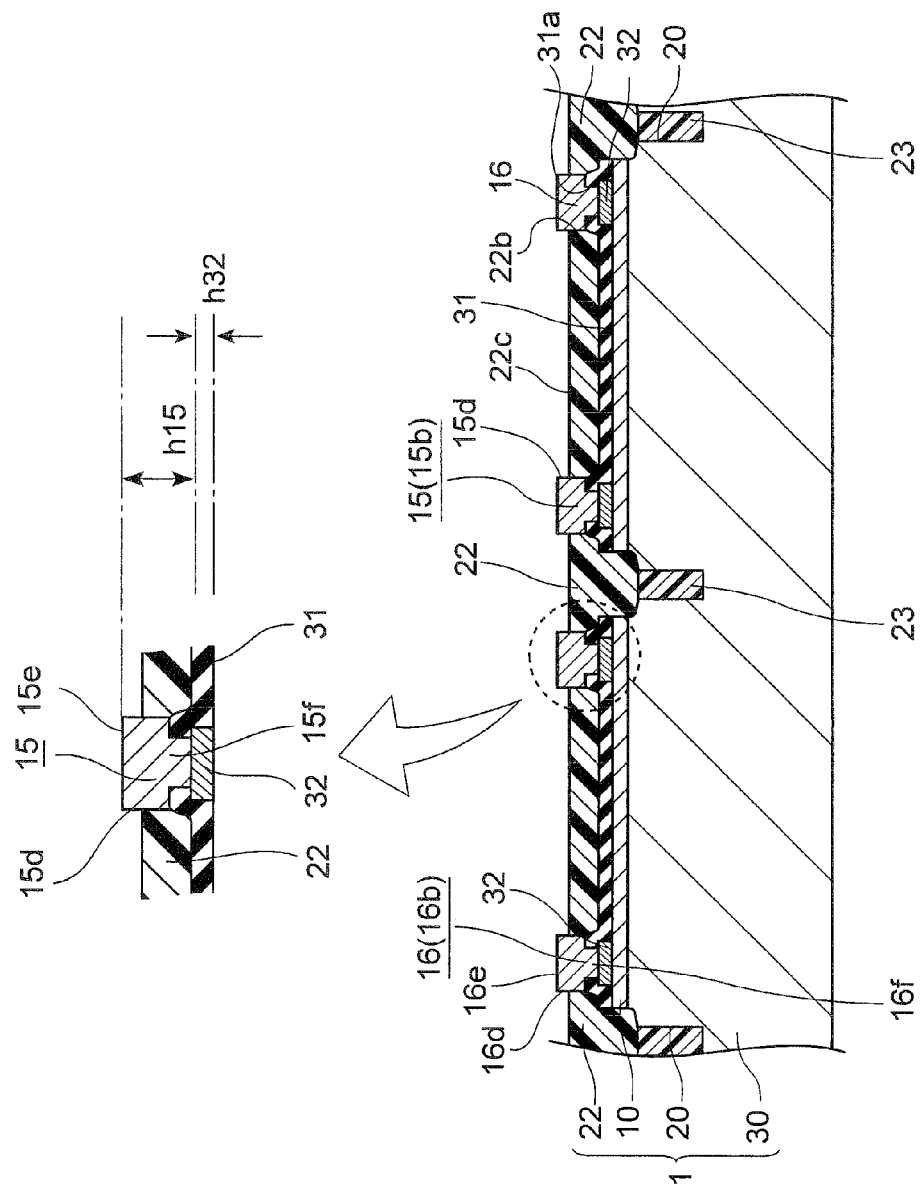
FIG. 3 is a sectional view taken along the line 3-3 in FIG. 2.
Figure 5:
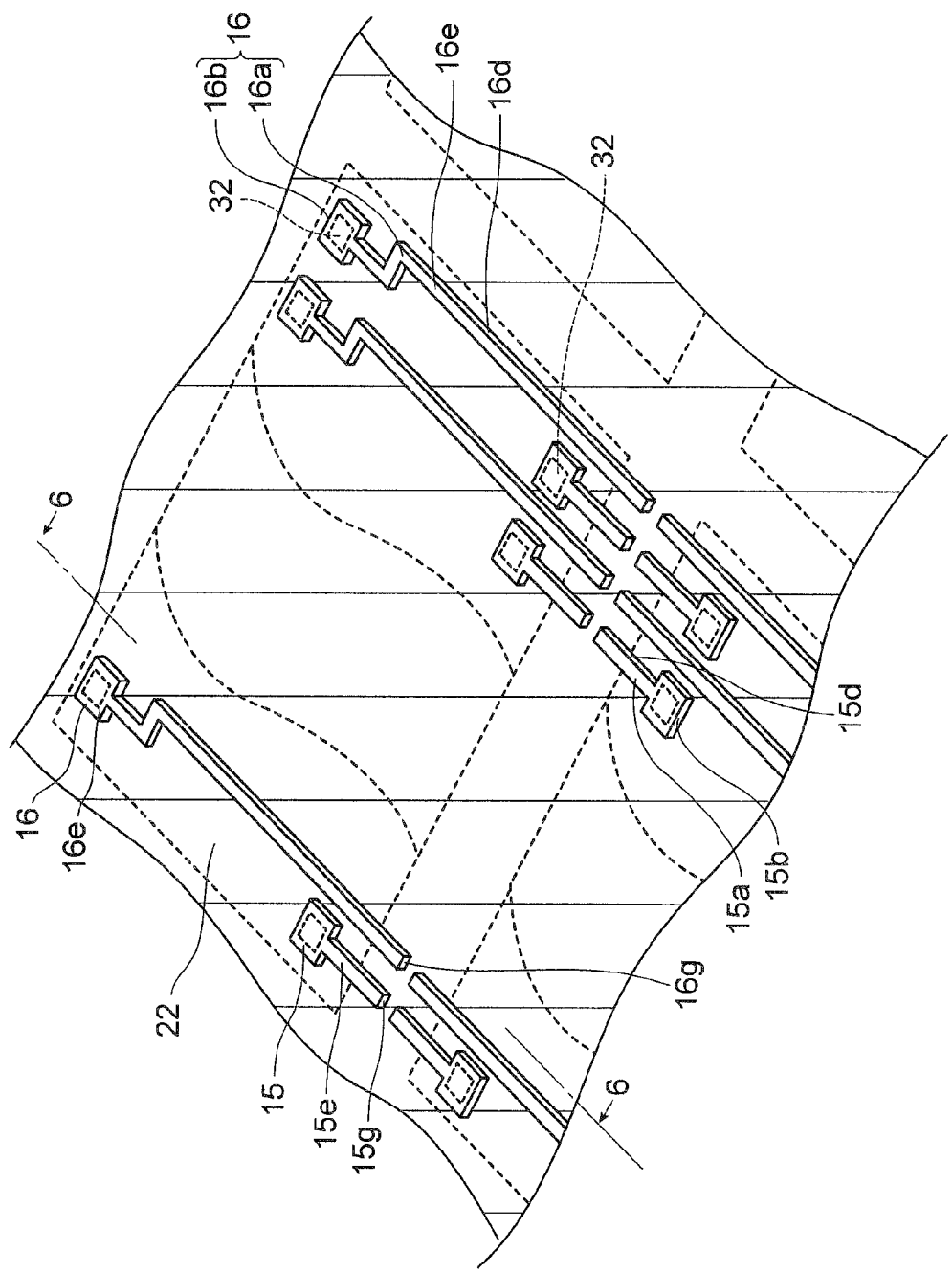
FIG. 5 is a perspective view illustrating an essential part of the semiconductor wafer in FIG. 1 with a part thereof omitted.

FIG. 1 is a perspective view illustrating the whole semiconductor wafer 1 according to the first embodiment of the present invention. FIG. 2 is a plan view illustrating a device region 10 and a region surrounding it formed in the semiconductor wafer 1, and FIG. 3 is a sectional view taken along the line 3-3 in FIG. 2. FIG. 5 is a perspective view illustrating an essential part of the semiconductor wafer 1 with a part thereof omitted, and FIG. 6 is a sectional view taken along the line 6-6 in FIG. 5.

The semiconductor wafer 1 is composed using a silicon wafer 2. The semiconductor wafer 1 has, as illustrated in FIG. 1, scribe lines 3A and 3B formed on a first surface 1a of the silicon wafer 2 (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B. The later-described device region 10 is formed within a region surrounded by the adjacent scribe lines 3A, 3A and 3B, 3B.

The semiconductor wafer 1 further has groove portions 20 and 21 formed in the first surface 1a. The groove portions 20 and 21 are formed along the scribe lines 3A and 3B, respectively.

Figure 6:
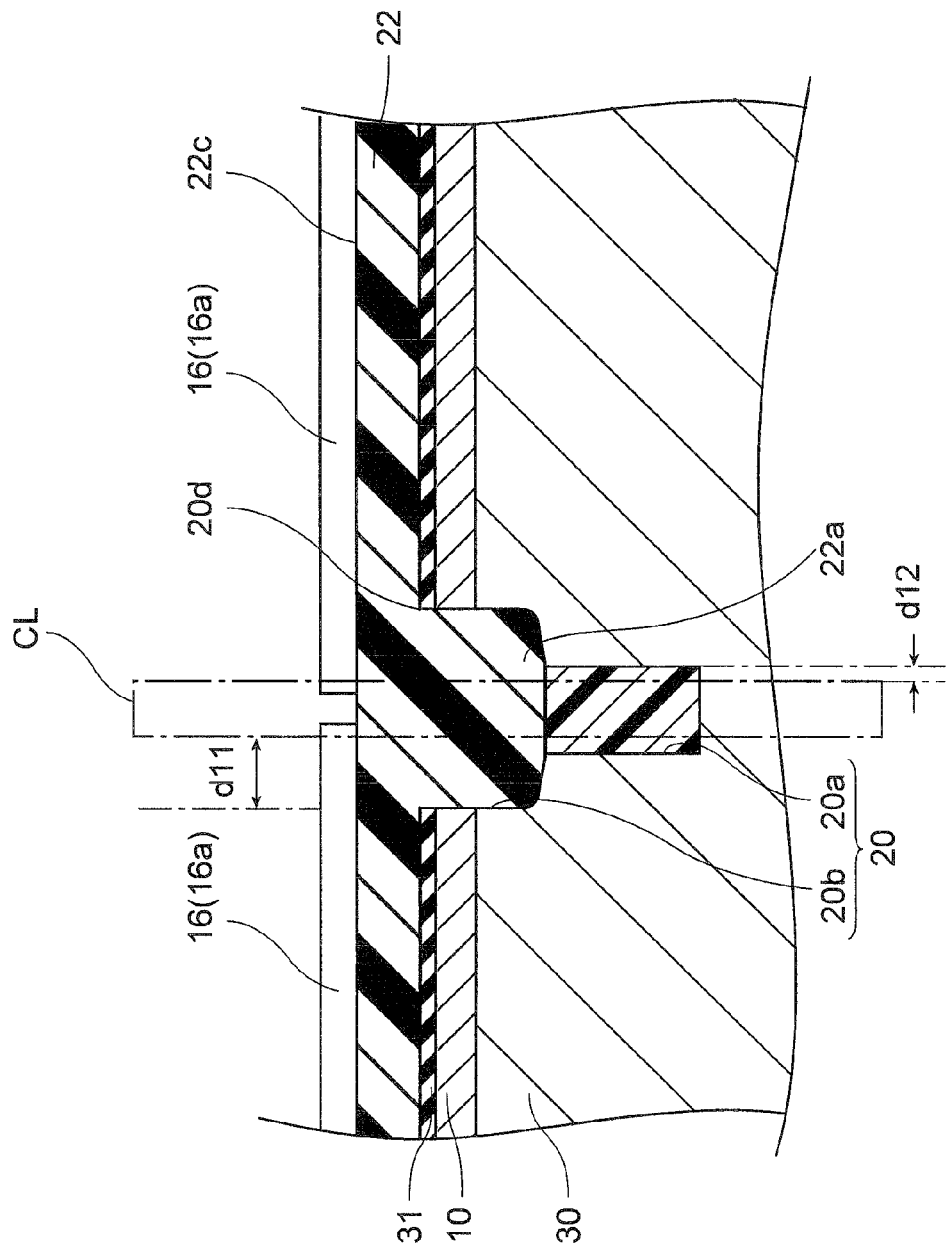
FIG. 6 is a sectional view taken along the line 6-6 in FIG. 5.

The groove portion 20 has a groove lower portion 20a and a wide width portion 20b and is formed in a direction almost orthogonal to the first surface 1a as illustrated in FIG. 6 in detail.

Figure 12:
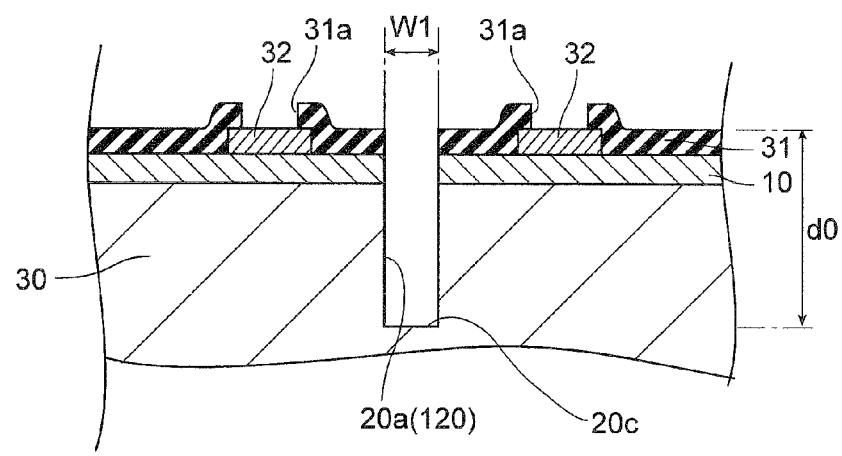
FIG. 12 is a sectional view of the semiconductor wafer mainly illustrating a groove portion, in which (A) shows a state in which a first groove portion forming step has been executed, and (B) shows a state in which a second groove portion forming step has been executed.
Figure 12:
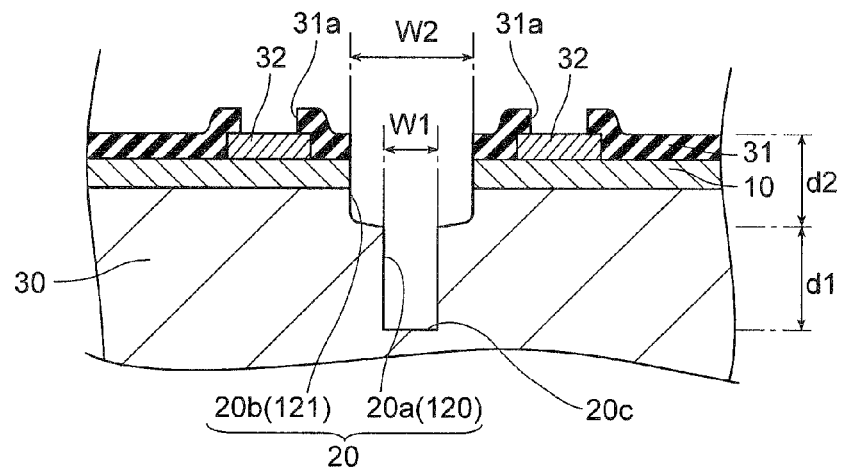
Figure 13:
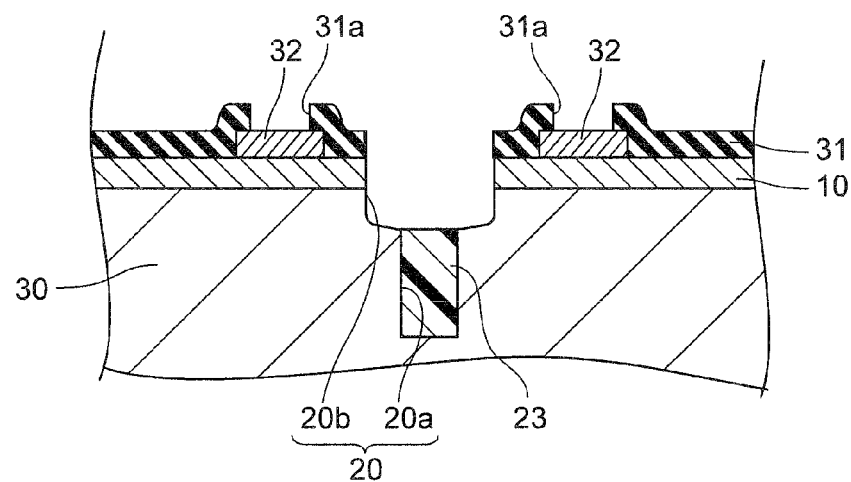
FIG. 13 is a sectional view of the semiconductor wafer subsequent to that in FIG. 12, in which (A) shows a state in which a lower insulating layer has been formed and (B) shows a state in which an upper insulating layer and a surface insulating layer have been formed.
Figure 13:
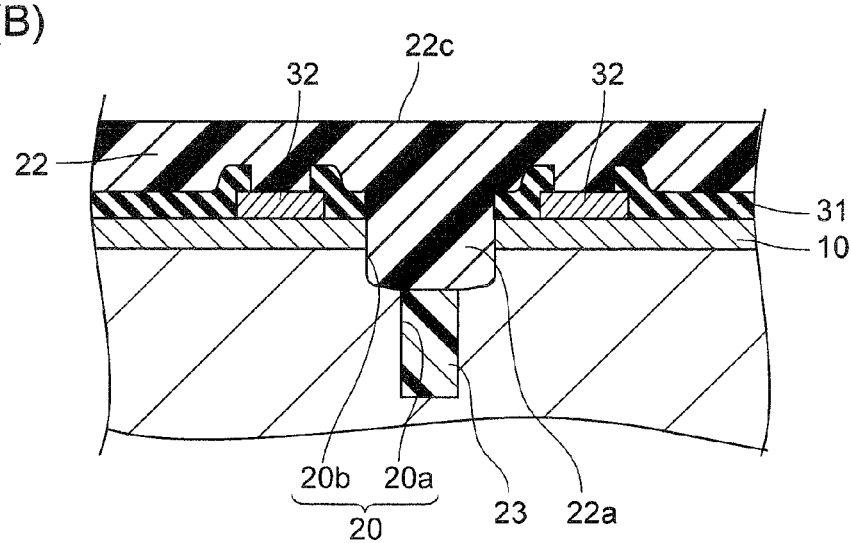

The groove lower portion 20a is a portion including a bottom portion 20c of the groove portion 20 and having a certain height from the bottom portion 20c (see FIG. 12, FIG. 13 about the bottom portion 20c). The groove lower portion 20a is a lower portion of the groove portion 20 which a resin relatively hardly enters, and has a width w1 (about 60 µm to about 80 µm) and a depth d1 (about 10 µm to about 40 µm) as illustrated in FIGS. 12(A), (B). Inside the groove lower portion 20a, a later-described lower insulating layer 23 is formed as illustrated in FIG. 3, FIG. 6 and so on.

The wide width portion 20b is a portion arranged on the upper side of the groove lower portion 20a in the groove portion 20, which is a portion including an inlet port 20d of the groove portion 20 and having a certain depth from the inlet port 20d. The wide width portion 20b is formed wider than the groove lower portion 20a and is formed over the entire length direction of the inlet port 20d of the groove portion 20. In other words, as illustrate in FIGS. 12(A), (B), a width w2 of the wide width portion 20b is larger than the width w1 of the groove lower portion 20a (w2>w1). The width w2 of the wide width portion 20b is about 80 µm to about 120 µm, and a depth d2 of the wide width portion 20b is about 10 µm to about 40 µm. Further, a later-described upper insulating layer 22a is formed inside the wide width portion 20b.

The groove portion 21 has a groove lower portion 21a and a wide width portion 21b and is formed in a direction almost orthogonal to the first surface 1a. The groove lower portion 21a is a portion having a certain height from a bottom portion similarly to the groove lower portion 20a, and has the same width and depth as those of the groove lower portion 20a. Inside the groove lower portion 21a, a lower insulating layer 23 is formed as in the groove lower portion 20a. The wide width portion 21b is a portion arranged on the upper side of the groove lower portion 21a. The wide width portion 21b is formed wider than the groove lower portion 21a and has the width and the depth similar to those of the wide width portion 20b. An upper insulating layer 22a is formed inside the wide width portion 21b as in the wide width portion 20b.

As described above, the groove portions 20 and 21 have a wide-port structure in which the wide width portion 20b and the wide width portion 21b wider than the groove lower portions 20a and 21a are formed at the respective inlet ports. In addition, the insulating layer having a double-layer structure in which the upper insulating layer 22a is laminated on the lower insulating layer 23 is formed inside the groove portions 20 and 21.

The semiconductor wafer 1 has a surface insulating layer 22 as illustrated in detail in FIG. 3. The surface insulting layer 22 is formed to cover the device region 10, and thus the surface insulting layer 22 covers almost the whole first surface 1a of the semiconductor wafer 1 to constitute a surface layer of the semiconductor wafer 1. The surface insulating layer 22 has a larger thickness than that of a later-described protecting insulating layer 31 and has a surface 22c formed flat, and is disposed at the outermost position of the semiconductor wafer 1 except for portions where later-described wiring electrodes 15 and wiring electrodes 16 are formed.

Further, the surface insulating layer 22 is structured integrally with an upper insulating layer 22a formed inside the groove portions 20 and 21, and is thus formed in one body without joints between the upper insulating layer 22a and other portions. The surface insulating layer 22 is formed with a plurality of contact holes 22b, and one wiring electrode 15 or one wiring electrode 16 is formed in each of the contact holes 22b.

The surface insulating layer 22 can be formed using a resin such as an epoxy resin or a polyimide resin, or an insulating material made of silicon silicate glass (SOG) or the like. In this embodiment, a case using a resin for the surface insulating layer 22 is discussed. It is especially preferable to form the surface insulating layer 22 using a resin having a low thermal expansion coefficient. This ensures that when the semiconductor wafer 1 is cut along the groove portions 20 and 21 by a dicing saw, the cutting can be easily performed.

The lower insulating layer 23 is formed also using a resin similarly to the surface insulating layer 22. The lower insulating layer 23, however, is formed using a low-viscosity resin having a lower viscosity than that of the resin forming the surface insulating layer 22.

The semiconductor wafer 1 has a silicon substrate 30 composed of the silicon wafer 2, and upper portions thereof are the device regions 10. A plurality of connecting pads 32 are formed on the surface of the device region 10, and a portion other than the connecting pads 32 is covered with the protecting insulating layer 31.

The protecting insulating layer 31 is disposed under the surface insulating layer 22 and formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15 and 16 to the connecting pads 32. The connecting pads 32 are connected to the semiconductor device in the device region 10 (see FIG. 4 for details).

The device region 10 is a rectangular region surrounded by the adjacent groove portions 20 and 20 and the groove portions 21 and 21 as illustrated in detail in FIG. 2. A plurality of the device regions 10 are formed on the first surface 1a, and each of them is a unit region divided from adjacent regions by the groove portions 20 and 21.

Each of the device regions 10 has the memory portion formed on the first surface 1a by performing wafer process, and a plurality of wiring electrodes 15 and 16 are formed. Note that the wafer process means a manufacturing process of forming a semiconductor element and an integrated circuit on the wafer such as the silicon wafer 2 or the like.

In addition to the memory portion, an integrated circuit and a semiconductor element such as a CPU, a sensor, a drive circuit for the sensor may be formed as the semiconductor devices within the device region 10. Further, a memory portion and an integrated circuit constituting a controller for controlling the memory portion may be formed in the device region 10.

The wiring electrode 15 is made of a conductive material such as Cu or the like. The wiring electrode 15 has an extended terminal portion 15a and a rectangular electrode pad 15b, and the extended terminal portion 15a and the rectangular electrode pad 15b have, as a whole, a protruding structure rising above the surface 22c of the surface insulating layer 22 into a three-dimensional shape.

Figure 23:
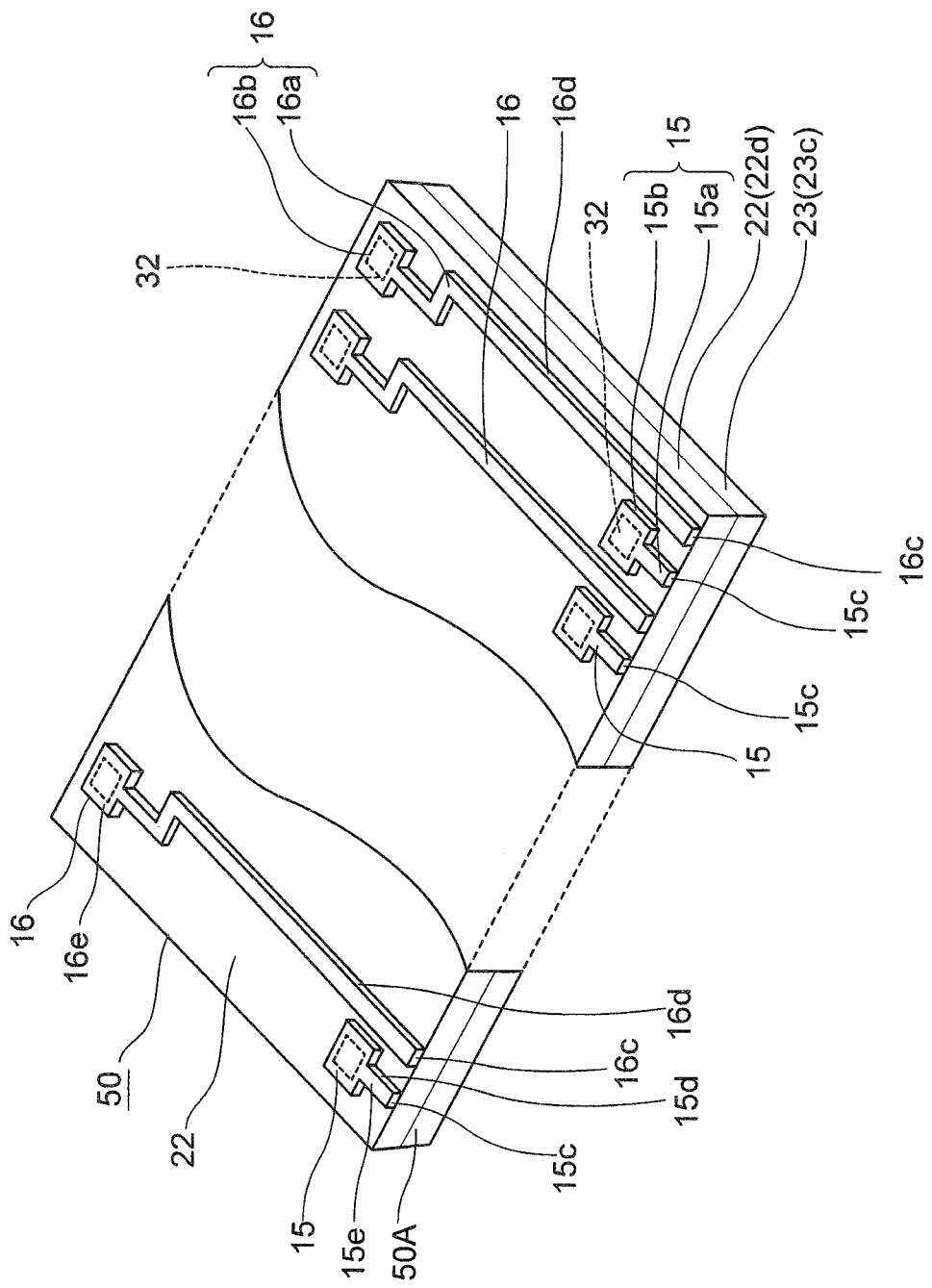
FIG. 23 is a perspective view illustrating an example of a device plate constituting the laminated chip package.

The wiring electrode 15 is illustrated in detail in FIG. 5 and FIG. 23 in addition to FIG. 3. An end face 15g of the extended terminal portion 15a of the wiring electrode 15 is a projecting end face projecting outward from the surface 22c of the surface insulating layer 22. Further, the wiring electrode 15 has a cross side surface 15d, a top end face 15e, and an embedded portion 15f.

The cross side surface 15d is a side surface portion projecting outward from the surface 22c of the surface insulating layer 22 and crossing with the surface 22c to rise up from (almost intersecting to) the surface 22c. The top end face 15e is connected to the cross side surface 15d and projects outward from the surface 22c, and further has a rectangular portion disposed in a direction along the surface 22c and a band-shaped portion extending from the rectangular portion in a direction along the surface 22c toward the groove portion 20. The embedded portion 15f is a portion embedded inward from the surface 22c to connect to the connecting pad 32.

The electrode pad 15b is composed of the cross side surface 15d, the top end face 15e, and the embedded portion 15f, and the extended terminal portion 15a is composed of the cross side surface 15d and the top end face 15e.

The electrode pad 15b is connected to the connecting pad 32 via the contact hole 22b and the connecting hole 31a which are arranged to be stacked one on the other, and has a depth reaching the connecting pad 32. More specifically, the electrode pad 15b has a height (an expanded height) h15 expanded from the top end face 15e outer than the surface 22c to the connecting pad 32 via the contact hole 22b and the connecting hole 31a. The expanded height h15 is larger than a height h32 of the connecting pad 32 (h15>h32). For example, h15 is about 2 to 6 µm, and h32 is about 0.5 to 1 µm.

The wiring electrode 16 is also made of a conductive material such as Cu or the like. The wiring electrode 16 has an extended terminal portion 16a and a rectangular electrode pad 16b, and the extended terminal portion 16a and the electrode pad 16b have, as a whole, a protruding structure like the wiring electrode 15. An end face 16g of the extended terminal portion 16a of the wiring electrode 16 is a projecting end face projecting outward from the surface 22c.

Further, the wiring electrode 16 has a cross side surface 16d, a top end face 16e, and an embedded portion 16f. The cross side surface 16d is a side surface portion crossing with the surface 22c, like the cross side surface 15d. The top end face 16e has a rectangular portion disposed in a direction along the surface 22c and a band-shaped portion extending from the rectangular portion in a direction along the surface 22c toward the groove portion 20, like the top end face 15e. The embedded portion 16f is a portion embedded inward from the surface 22c and connected to the connecting pad 32, like the embedded portion 15f. Further, the electrode pad 16b is composed of the cross side surface 16d, the top end face 16e, and the embedded portion 16f, and the extended terminal portion 16a is composed of the cross side surface 16d and the top end face 16e. The electrode pad 16b also has an expanded height like the electrode pad 15b.

The extended terminal portions 15a and the electrode pads 15b of the wiring electrodes 15 are formed along a part of the outer periphery of the device region 10, whereas the extended terminal portions 16a of the wiring electrodes 16 are formed across the device region 10. Further, the electrode pads 16b are disposed along a part of the outer periphery of the device region 10 to be opposed to the electrode pads 15b.

Respective portions of the extended terminal portions 15a and the extended terminal portions 16a extend from the device region 10 into the groove portion 20. More specifically, the extended terminal portions 15a and the extended terminal portions 16a are formed such that their respective portions on their tip sides apart from the electrode pads 15b and 16b bulge out from an edge portion (the above-described inlet port 20d) of the groove portion 20 and stay inside the groove portion 20 in the width direction. Further, the extended terminal portions 15a and the extended terminal portions 16a are formed such that their respective portions extending out from the device region 10 are in a protruding shape rising above the surface 22c of the surface insulating layer 22.

Further, as illustrated in FIG. 2, FIG. 5, and FIG. 6, the extended terminal portions 15a and the extended terminal portions 16a bulge out from both sides in the width direction of the groove portion 20 such that the end faces 15g are opposed to each other with slight separation therebetween and the end faces 16g are opposed to each other with slight separation therebetween, near the middle in the width direction of the groove portion 20.

The semiconductor wafer 1 has the extended terminal portions 15a and the extended terminal portions 16a. Therefore, in the cut surfaces when the semiconductor wafer 1 is cut along the groove portions 20, the later-described end faces 15c and 16c appear projecting outward from the surface 22c.

Further, a number of the wiring electrodes 15 and 16 are alternately arranged along the groove portion 20. These wiring electrodes 15 and 16 are united together to form a wiring electrode group 17. Further, in the wiring electrodes 15 and 16, the extended terminal portions 15a and 16a are extended only to the groove portion 20 on the left side or the right side that is a part of the four groove portions which are all of the groove portions surrounding and contacting with the device region 10, that is, the adjacent two groove portions 20 and 20 and two groove portions 21 and 21. The wiring electrode group 17 has an unevenly distributed structure by such an unevenly distributed arrangement of the extended terminal portions 15a and 16a.

Figure 4:
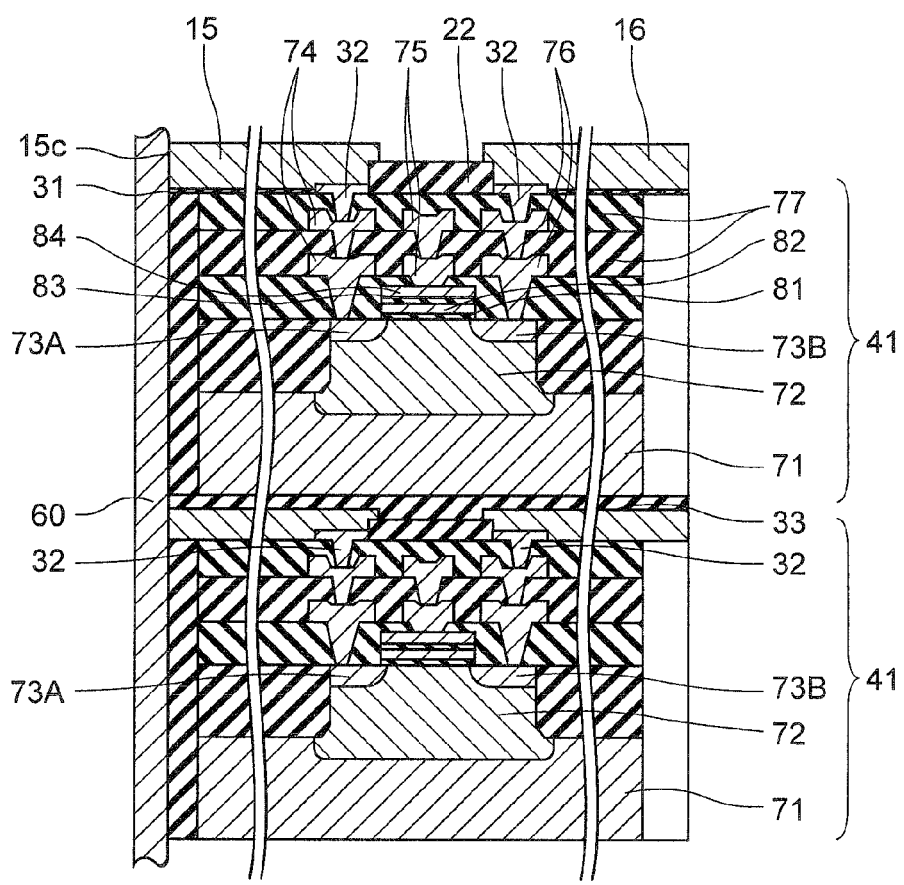
FIG. 4 is a sectional view mainly illustrating memory cells of a laminated chip package using two semiconductor wafers.

In the memory portion of the device region 10, a number of memory cells 41 as the semiconductor devices are formed. The memory cell 41 has a structure as illustrated in FIG. 4. FIG. 4 is a sectional view mainly illustrating memory cells 41 of a later-described laminated chip package 100 using two semiconductor wafers 1.

To the memory cell 41, the wiring electrodes 15 and 16 are connected via the connecting pads 32. The memory cell 41 is formed on the surface of an N-type substrate 71 constituting the semiconductor wafer 1. In FIG. 4, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

Method of Manufacturing Semiconductor Wafer

Figure 7:
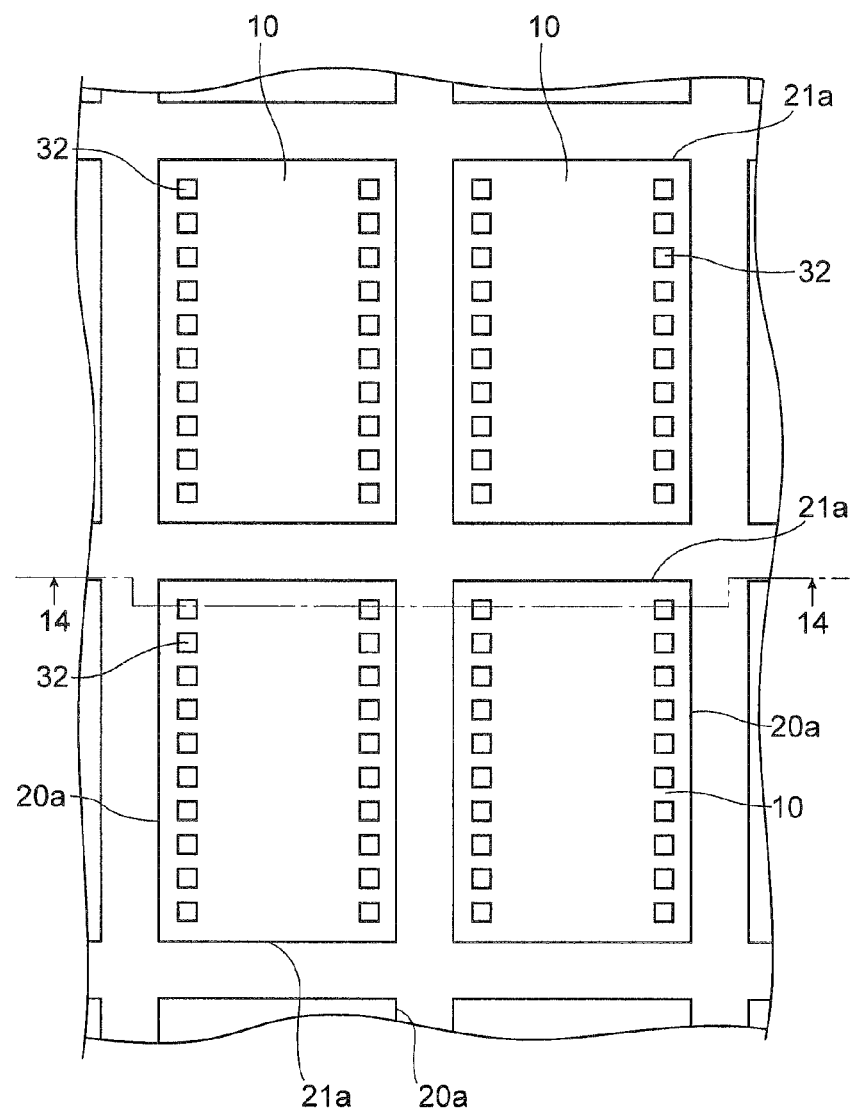
FIG. 7 is a plan view similar to FIG. 2, illustrating the partially manufactured semiconductor.
Figure 8:
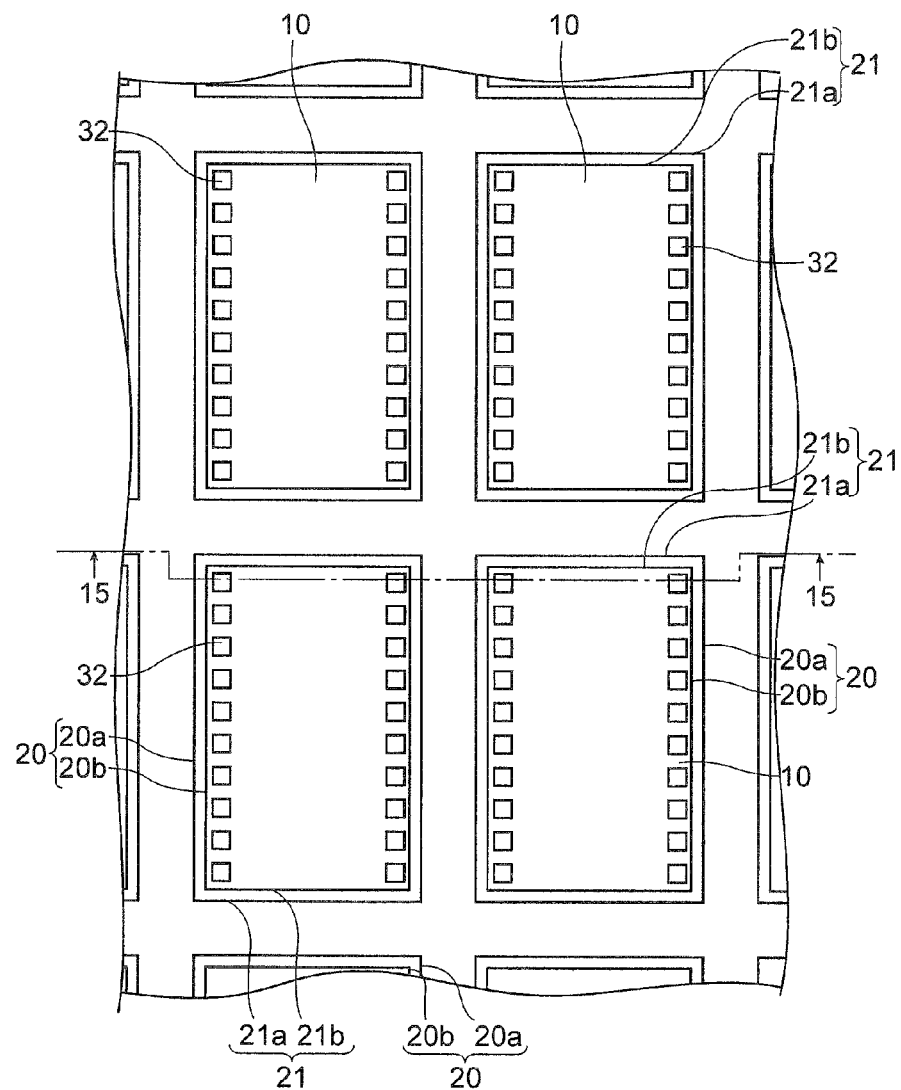
FIG. 8 is a plan view similar to FIG. 2, illustrating the semiconductor wafer subsequent to that in FIG. 7.
Figure 9:
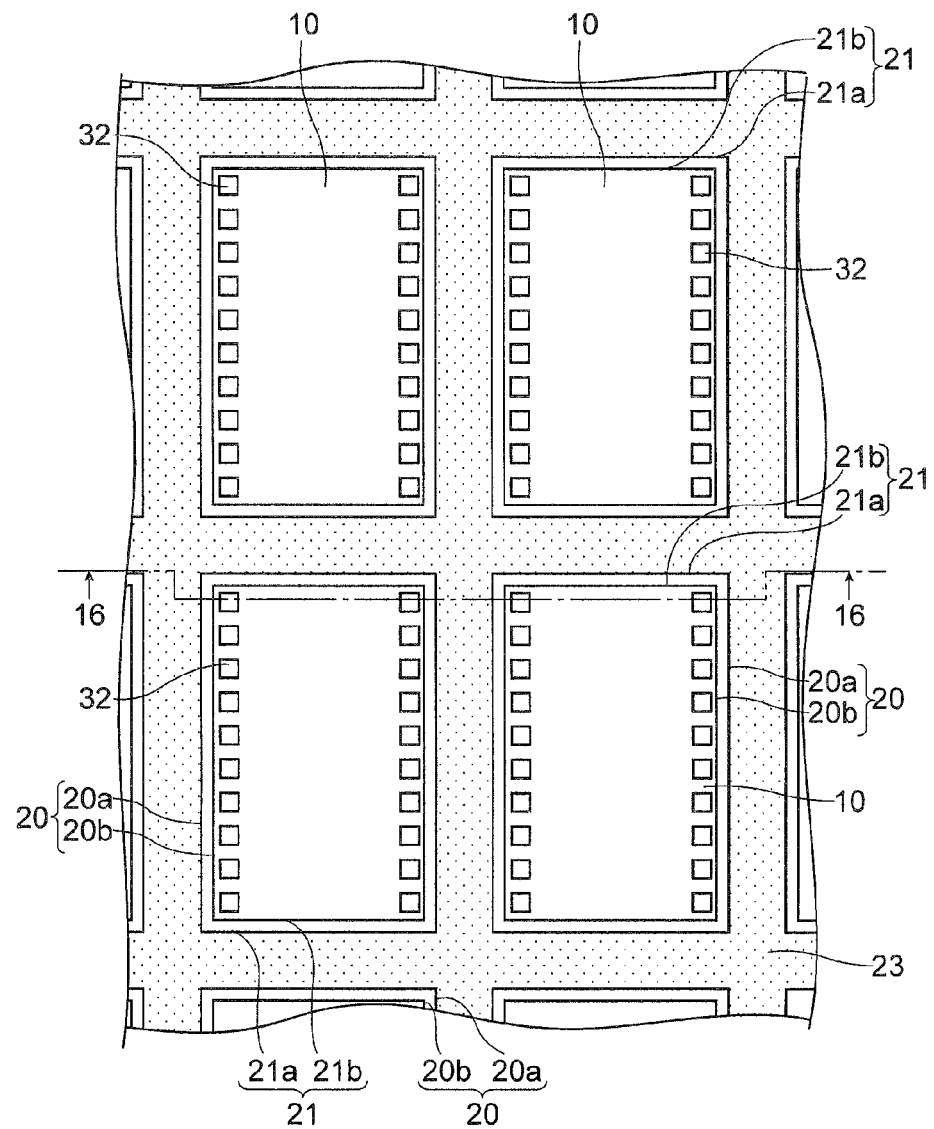
FIG. 9 is a plan view similar to FIG. 2, illustrating the semiconductor wafer subsequent to that in FIG. 8.
Figure 10:
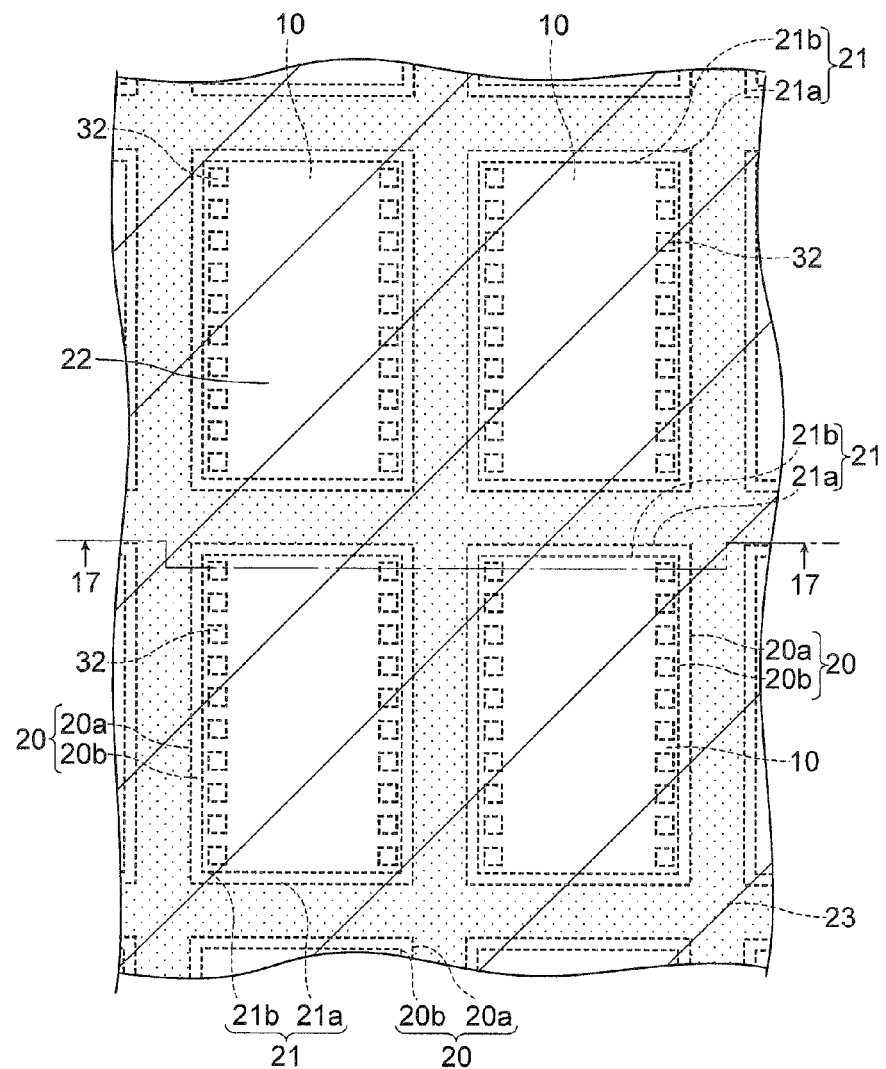
FIG. 10 is a plan view similar to FIG. 2, illustrating the semiconductor wafer subsequent to that in FIG. 9.
Figure 11:
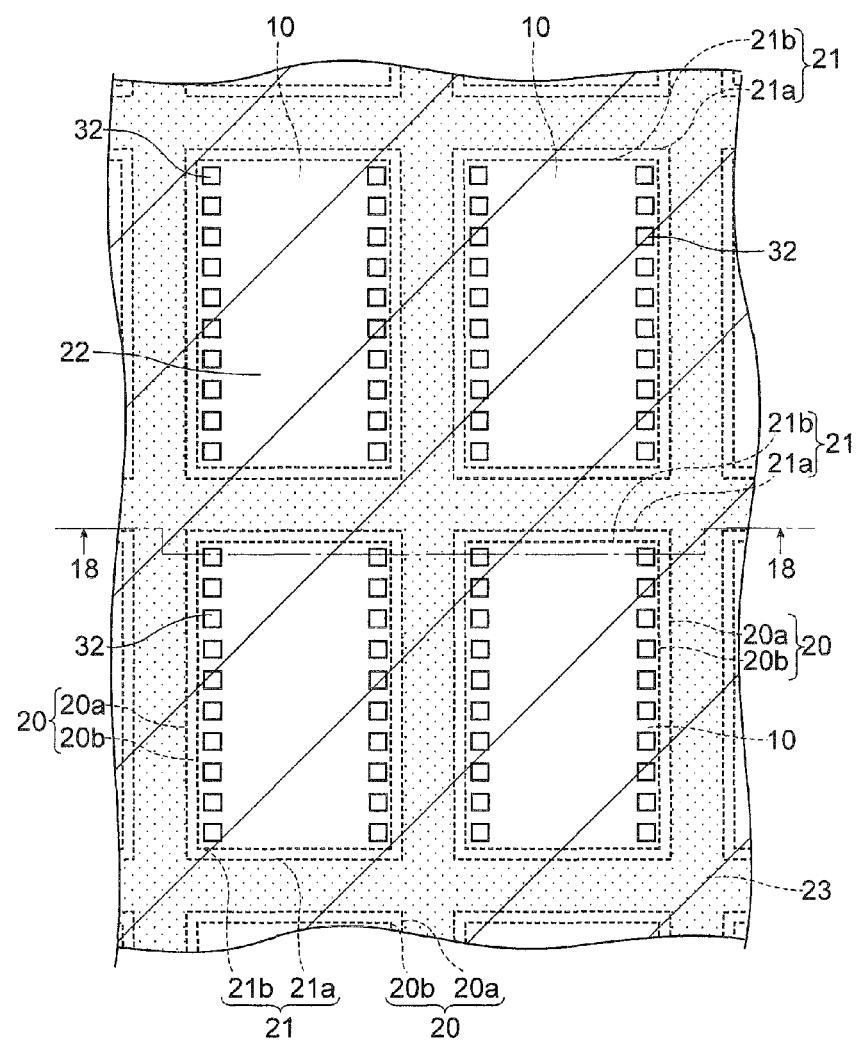
FIG. 11 is a plan view similar to FIG. 2, illustrating the semiconductor wafer subsequent to that in FIG. 10.

Subsequently, the method of manufacturing the semiconductor wafer 1 having the above-described structure will be described with reference to FIG. 7 to FIG. 18. Here, FIG. 7 is a plan view similar to FIG. 2, illustrating the partially manufactured semiconductor wafer, and FIG. 8 is a plan view similar to FIG. 2, illustrating the semiconductor wafer subsequent to that in FIG. 7. FIG. 9 to FIG. 11 is a plan view similar to FIG. 2, illustrating the semiconductor wafer subsequent to that in the order. FIG. 12 is a sectional view of the semiconductor wafer mainly illustrating the groove portion; in which (A) shows a state in which a first groove portion forming step has been executed, and (B) shows a state in which a second groove portion forming step has been executed. FIG. 13 is a sectional view of the semiconductor wafer subsequent to that in FIG. 12, in which (A) shows a state in which the lower insulating layer has been formed and (B) shows a state in which the upper insulating layer and the surface insulating layer have been formed. FIG. 14 to FIG. 18 is a sectional view taken along the line 14-14, the line 15-15, the line 16-16, the line 17-17, the line 18-18 in FIG. 7 to FIG. 11, respectively. Note that hatching is given to the surface insulating layer 22 in FIG. 10 and FIG. 11 for convenience of illustration.

Figure 14:
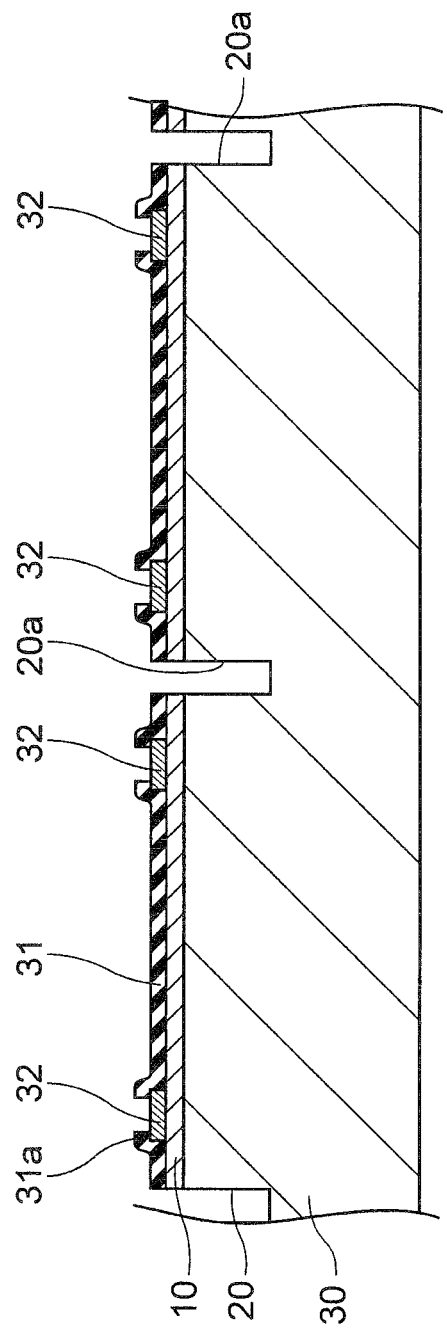
FIG. 14 is a sectional view taken along the line 14-14 in FIG. 7.

For manufacturing the semiconductor wafer 1, a wafer (unprocessed wafer) is prepared which hag memory portions and a plurality of connecting pads 32 formed in the device regions 10 by performing wafer process. Then, the protecting insulating layer 31 is formed on the first surface 1a for the unprocessed wafer, and then the connecting holes 31a are formed at the locations in the protecting insulating layer 31 where the connecting pads 32 are to be formed, as illustrated in FIG. 14. Then, the groove portions 20 and 21 are formed along the scribe lines 3A and 3B. The groove portions 20 and 21 can be formed by the dicing saw, and may be formed by etching such as the reactive ion etching or the like.

When forming the groove portions 20 and 21, the following first groove portion forming step and second groove portion forming step are sequentially executed.

In the first groove portion forming step, as illustrated in FIG. 7, FIG. 12(A), and FIG. 14, groove portions (first groove portions 120) having a first width and a first depth are formed in the first surface 1a along the scribe lines 3A and 3B using a not-shown first blade (cutting blade). In the first groove portion 120, a portion having a certain height from its bottom portion will form the groove lower portion 20a or the groove lower portion 21a afterward. Here, the first width, which is the above-described width w1, is about 60 μm to about 80 μm, and the first depth, which is the depth d0 illustrated in FIG. 12(A), is about 40 μm to about 80 μm.

Figure 15:
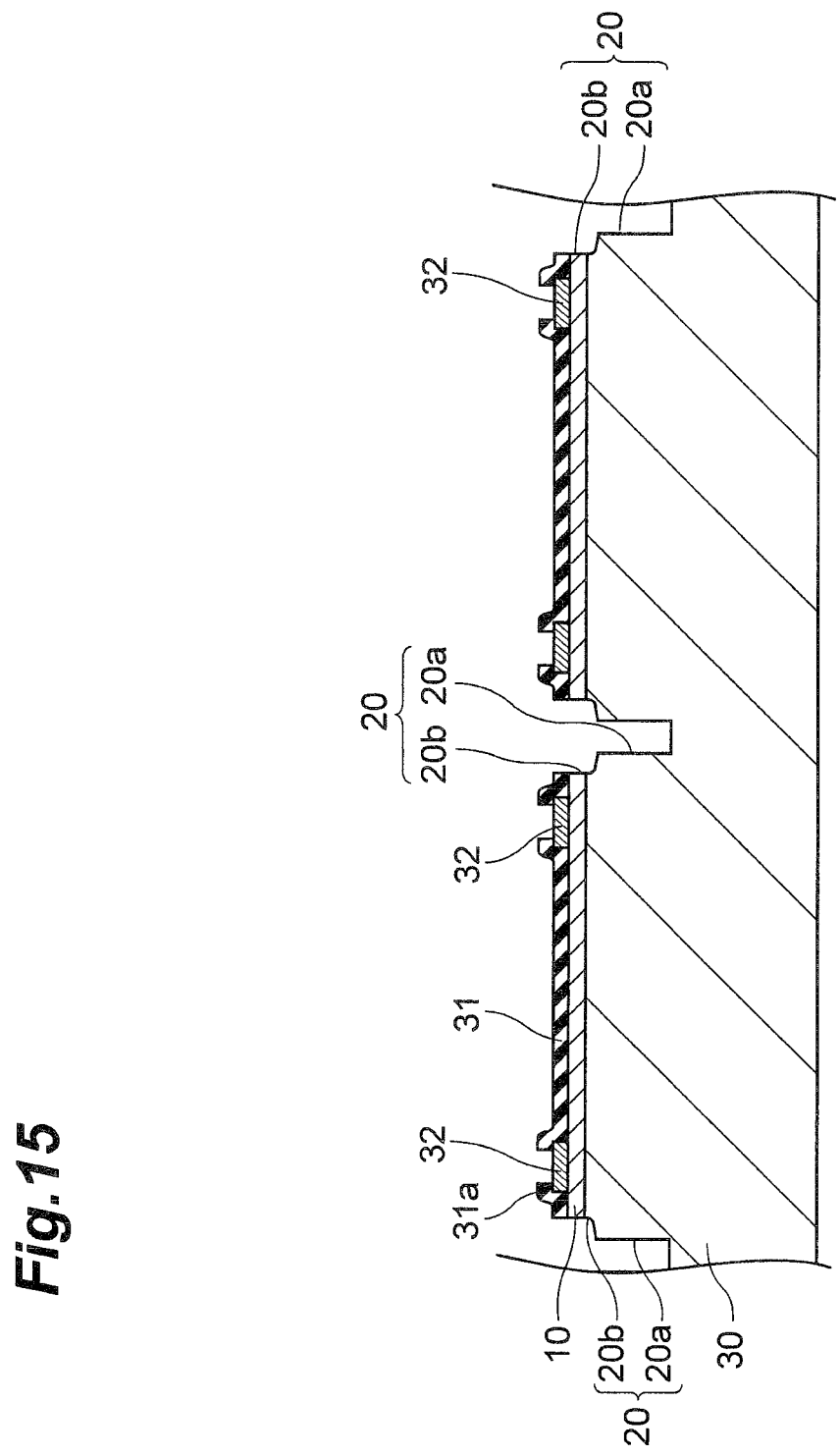
FIG. 15 is a sectional view taken along the line 15-15 in FIG. 8.

Subsequently, the second groove portion forming step is executed. In the second groove portion forming step, as illustrated in FIG. 8, FIG. 12(B), and FIG. 15, second groove portions 121 are formed at the inlet ports of the first groove portions 120 along the entire length direction of the first groove portions 120 using a not-shown second blade. The second groove portion 121 has a second width and a second depth. The second width, which is the above-described width w2, is about 80 μm to about 120 μm, and the second depth, which is the above-described depth d2, is about 10 μm to about 40 μm. The second width is larger than the first width, and the second depth d2 is shallower than the first depth d0 (d0>d2). By forming the second groove portions 121, portions having a certain height from the bottom portions of the first groove portions 120 form the groove lower portions 20a and the groove lower portions 21a, and portions on the upper side of the groove lower portions 20a and the groove lower portions 21a form the wide width portions 20b and the wide width portions 21b, respectively.

Then, an insulating layer forming step is executed. In the insulating layer forming step, prior to application of a resin for forming the surface insulating layer 22 (referred also to as a resin for surface layer) a low-viscosity resin having a viscosity lower than that of the resin for surface layer is applied to the first surface 1a. Then, the low-viscosity resin is uniformly spread over the first surface 1a using a not-shown spin coater. The low-viscosity resin has a high flowability because it is purling due to its low viscosity. Therefore, the low-viscosity resin surely enters the inside of the groove lower portions 20a and the groove lower portions 21a which a resin relatively hardly enters. In addition, due to the formation of the wide width portions 20b and 21b on the upper side of the groove lower portions 20a and the groove lower portions 21a respectively, the low-viscosity resin more easily enter the inside of the groove lower portions 20a and the groove lower portions 21a.

Figure 16:
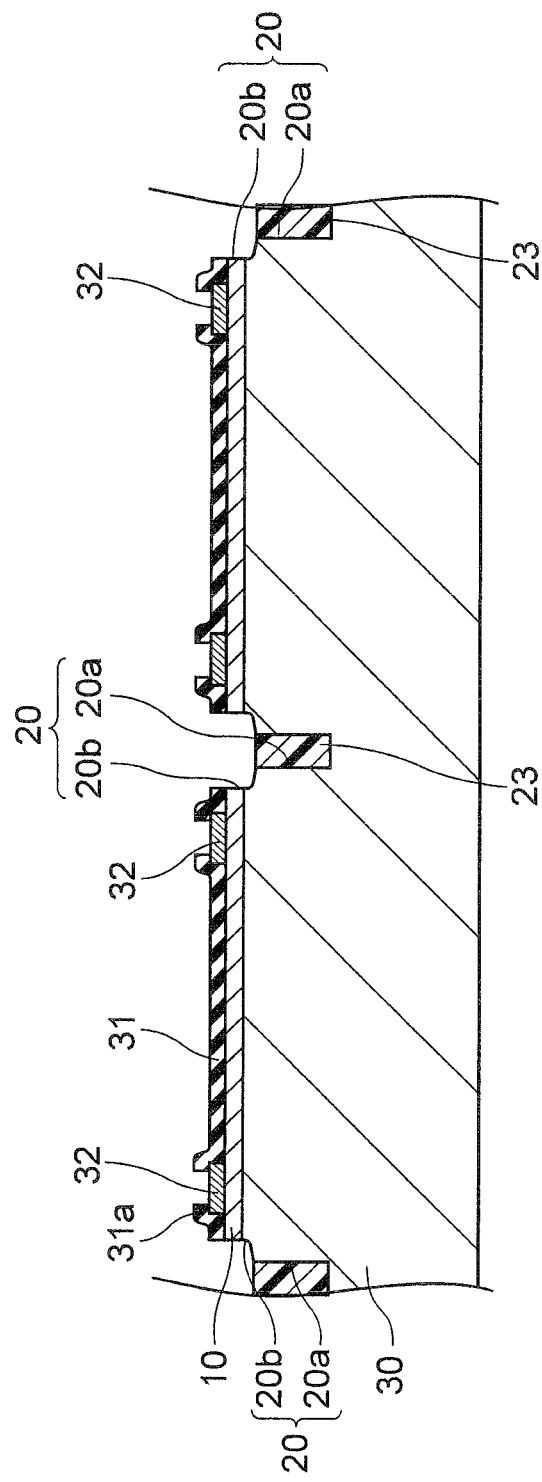
FIG. 16 is a sectional view taken along the line 16-16 in FIG. 9.

Thus, as illustrated in FIG. 9, FIG. 13(A), and FIG. 16, the low-viscosity resin remaining inside the groove lower portions 20a and the groove lower portions 21a forms the lower insulating layer 23. Note that the low-viscosity resin not only enters the inside of the groove portions 20 and 21 but also sometimes remains outside the groove portions 20 and 21 (for example, on the upper side of the protecting insulating layer 31) though illustration of the low-viscosity resin remaining outside the groove portions 20 and 21 is omitted.

Figure 17:
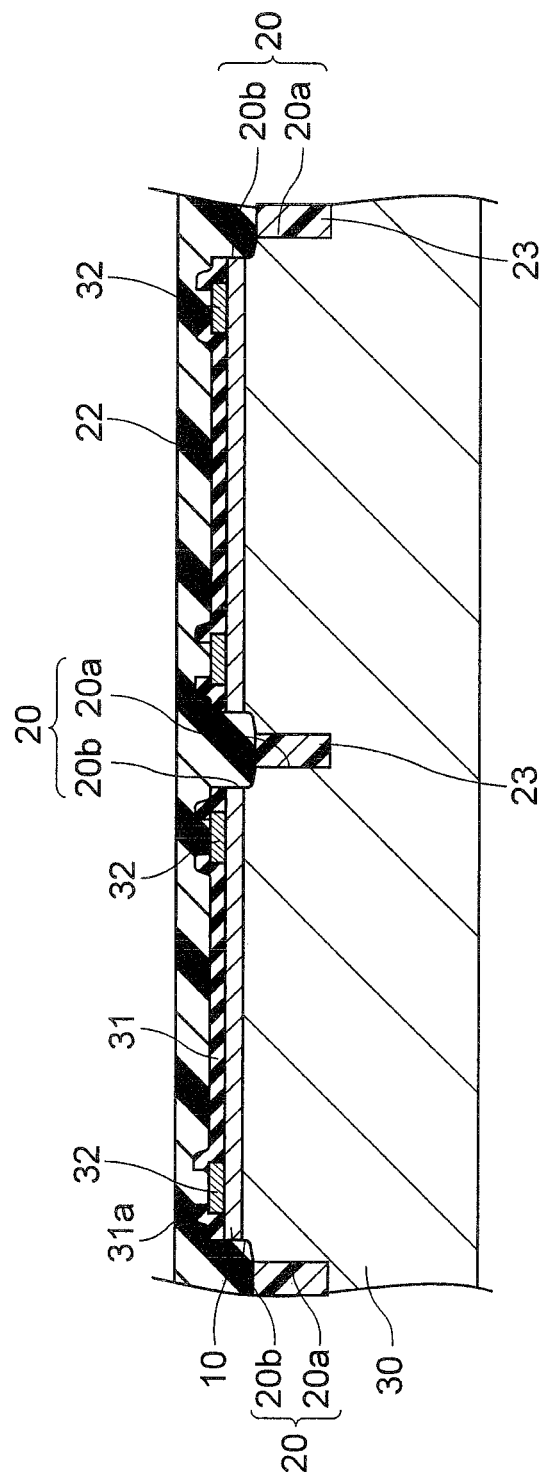
FIG. 17 is a sectional view taken along the line 17-17 in FIG. 10.

Next, a resin for surface layer is applied to the entire first surface 1a as illustrated in FIG. 10, FIG. 13(B), and FIG. 17. Then, the applied resin for surface layer is uniformly spread over the first surface 1a using the not-shown spin coater. The resin for surface layer is, for example, epoxy resin, polyimide resin or the like and is higher in viscosity and lower in flowability than the low-viscosity resin. Therefore, the resin for surface layer hardly enters the inside of a groove portion having a narrower width and a deeper depth. However, the wide width portions 20b and 21b are formed at the inlet ports of the groove portions 20 and 21. Thus, the resin for surface layer easily enters the inside of the groove portions 20 and 21.

By the application of the low-viscosity resin prior to the application of the resin for surface layer, the lower insulating layer 23 has been formed in the groove lower portions 20a and the groove lower portions 21a. Therefore, when the resin for surface layer enters the inside of the groove portions 20 and 21, the resin for surface layer forms an insulating layer different from the lower insulating layer 23 is formed inside the groove portions 20 and 21. This insulating layer forms the upper insulating layer 22a. Thus, the insulating layer having the double-layer structure is formed inside the groove portions 20 and 21.

Subsequently, the surface of the unprocessed wafer is polished to be planarized. Thus, the surface insulating layer 22 is formed to cover the entire surface of the unprocessed wafer. The portions of the applied resin for surface layer entered into the groove portions 20 and 21 form the upper insulating layer 22a, so that the surface insulating layer 22 is formed integrally with the upper insulating layer 22a.

Figure 18:
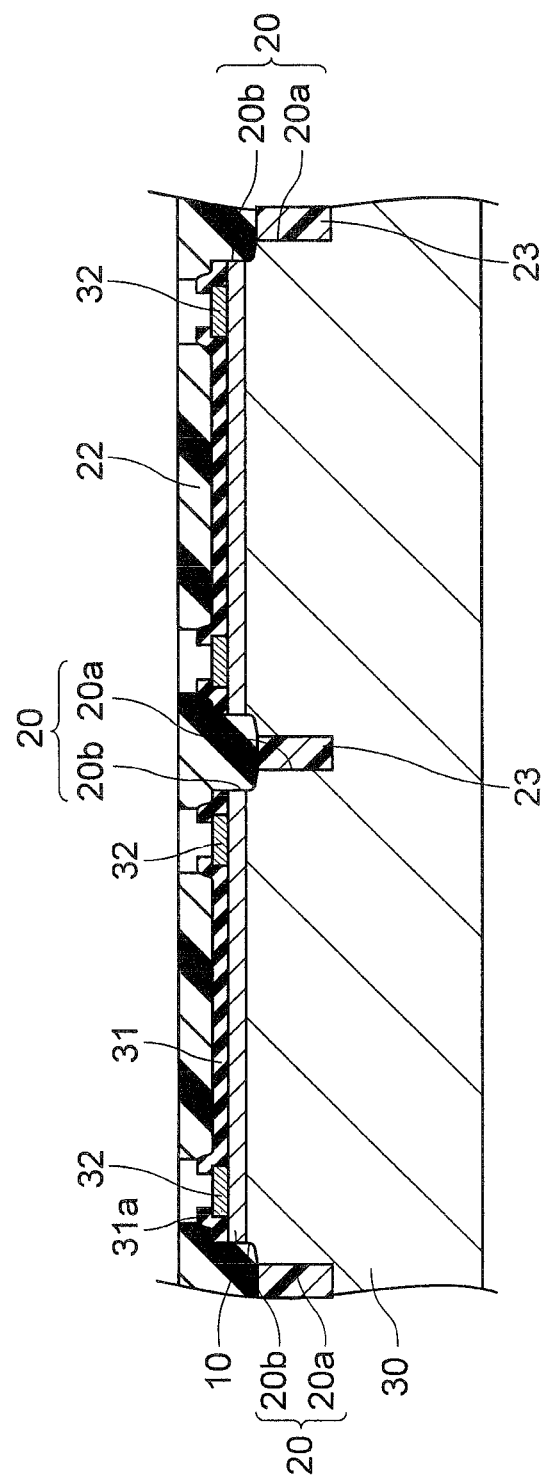
FIG. 18 is a sectional view taken along the line 18-18 in FIG. 11.

Subsequently, as illustrated in FIG. 11 and FIG. 18, the contact holes 22b are formed in the surface insulating layer 22 to expose the connecting pads 32. Thereafter, a wiring electrode forming process is performed to form the wiring electrodes 15 and 16. The wiring electrodes 15 and 16 are formed in a shape having the above-described protruding structure and including the extended terminal portions 15a and 16a respectively. The wiring electrodes 15 and 16 can be formed, for example, in the procedure as follows.

First, a not-shown seed layer for plating is formed on the surface insulating layer 22. Next, a frame (not shown) including groove potions is formed on the seed layer. The frame is formed, for example, by patterning a photoresist by the photolithography. Further, a plating layer which will be portions of the wiring electrodes 15 and 16 is formed within the groove portions of the formed frame and on the seed layer. Subsequently, the frame is removed, and a portion of the seed layer other than the portion which exists under the plating layer is removed by etching. By the above processing, the wiring electrodes 15 and 16 can be formed of the plating layer and the seed layer thereunder.

Because, the wiring electrodes 15 and 16 are formed after the formation of the surface insulating layer 22, the extended terminal portions 15a and 16a are formed in a manner that they are wholly disposed on the surface 22c of the surface insulating layer 22. The electrode pads 15b and 16b are formed such that their peripheral portions are disposed on the surface 22c and their center portions are embedded inward from the surface 22c to connect with the connecting pads 32.

Through the above process, the semiconductor wafer 1 having the above-described structure can be manufactured. In the semiconductor wafer 1, the groove portions 20 and 21 have the wide-port structure so that a liquid resin easily enters the inside of the groove portions 20 and 21. Therefore, when forming an insulating layer inside the groove portions 20 and 21 using a liquid resin, the resin surely enters the inside of the groove portions 20 and 21. This eliminates a situation that an unfilled portion (air gap) that is not filled with the resin is formed inside the groove portions 20 and 21. In short, the whole inside of the groove portions 20 and 21 is filled with the resin.

In the semiconductor wafer 1, the lower insulating layer 23 and the upper insulating layer 22a are formed of the resin filled without forming such an air gap. More specifically, the semiconductor wafer 1 has the groove portions 20 and 21 having a structure in which the inside of the groove portions 20 and 21 is filled with the insulating layer composed of a plurality of resins such as the low-viscosity resin and the resin for surface layer with no space (this structure is referred to as a "filled structure").

Incidentally, when manufacturing the laminated chip package 100 using the semiconductor wafer 1, it is necessary to laminate a plurality of semiconductor wafers 1 (described later for detail). For this reason, the load caused by the semiconductor wafers 1 laminated at the upper part acts on the semiconductor wafer 1 laminated at the lower part, and the load also acts on the extended terminal portions 15a and 16a. Portions on the tip end side of the extended terminal portions 15a and 16a are extended from the device region 10 and located on the upper side of the groove portion 20. Therefore, when the load from above acts on the extended terminal portions 15a and 16a, the tip end side of the extended terminal portions 15a and the tip end side of the extended terminal portions 16a, extending from the inlet port 20d of the groove portion 20, are likely to bow downward.

In the semiconductor wafer 1, however, the groove portions 20 and 21 have the filled structure, so that the lower insulating layer 23 and the upper insulating layer 22a never move inside the groove portions 20 and 21, and therefore the position of the surface 22c of the surface insulating layer 22 never shifts. The surface insulating layer 22, the upper insulating layer 22a, and the lower insulating layer 23 are supporting members supporting the extended terminal portions 15a and 16a, and their positions never shift so that the extended terminal portions 15a and 16a are surely supported by the surface insulating layer 22, the upper insulating layer 22a, and the lower insulating layer 23 (see FIG. 6). Accordingly, the extended terminal portions 15a and 16a are never deformed and can surely keep their original shapes even when the load from above acts thereon. Thus, by using the semiconductor wafer 1, the electrical connection of the laminated chip package can be surely established (described later for detail).

Further, in the groove portions 20 and 21, the wide width portions 20b and 21b are formed over the entire length direction of their inlet ports 20d. Therefore, the resin easily enters the inside of the whole groove portions 20 and 21. Thus, the extended terminal portions 15a and 16a which are not deformed can be formed at any portion of the groove portions 20 and 21.

Since the groove lower portions 20a and 21a of the groove portions 20 and 21 are located closer to the bottom portions, a resin relatively hardly enters them as compared to other portions. Hence, in the semiconductor wafer 1, the lower insulating layer 23 is formed inside the groove lower portions 20a and 21a using the low-viscosity resin. The low-viscosity resin has a high flowability and therefore surely enters even a portion hard to enter. Accordingly, the low-viscosity resin is very suitable for making the groove portions 20 and 21 in the filled structure. As described above, by using the low-viscosity resin in the semiconductor wafer 1, the filled structure of the groove portions 20 and 21 is more surely formed.

Figure 33:
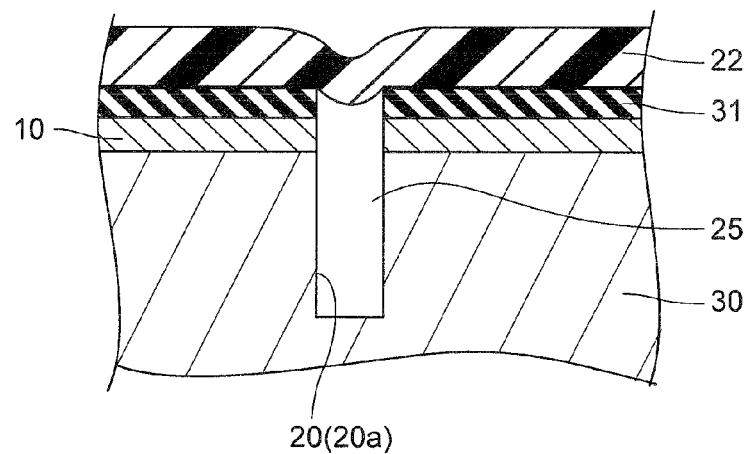
FIG. 33(A) is a sectional view schematically showing a case where the resin is applied to a groove portion including only the groove lower portion, (B) is a sectional view schematically showing a case where the resin is applied to a groove portion that is wider than that in (A)
Figure 33:
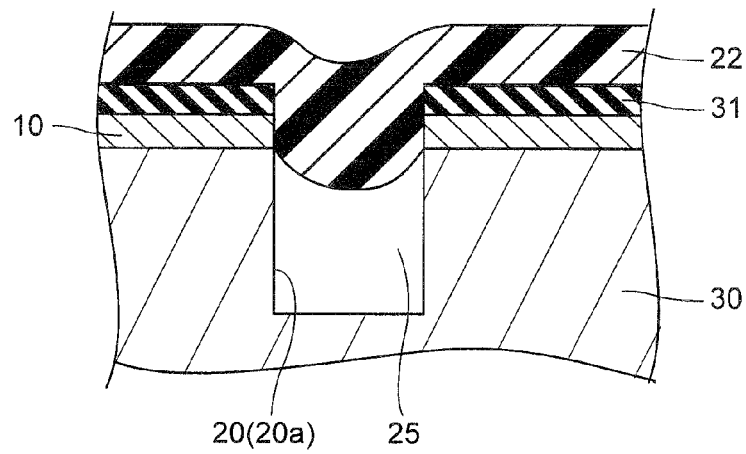

On the other hand, the resin for surface layer is higher in viscosity and lower in flowability than the low-viscosity resin. Therefore, if the groove portions 20 and 21 are composed only of the groove lower portions 20a and 21a and not in the wide-port structure, the resin for surface layer stays near the inlet port of the groove portion 20 (21) and hardly enters the inside thereof as illustrated in FIG. 33(A). Then, an air gap 25 in which no resin exists appears inside the groove portions 20 and 21 to cause the surface insulating layer 22 on the upper side of the groove portions 20 and 21 to bend. Further, since the resin for surface layer has a low flowability, it is difficult to make the groove portion 20 (21) in the filled structure even if the groove portion 20 (21) is widened about the width as illustrated in FIG. 33(B). Accordingly, it is difficult to avoid the situation that the air gap 25 appears inside the groove portion 20 (21) as well as to avoid the deformation of the extended terminal portions 15a and 16a by using the resin for surface layer only.

Hence, when manufacturing the semiconductor wafer 1, the low-viscosity resin is applied to the first surface 1a prior to the application of the rein for surface layer. This makes it possible to fill the inside of the groove lower portions 20a and 21a which a resin relatively hardly enters and the resin for surface layer is difficult to enter, with the low-viscosity resin before the inlet ports 20d of the groove portions 20 and 21 are closed with the resin for surface layer. Thus, occurrence of the air gap 25 is completely eliminated, so that the filled structure of the groove portions 20 and 21 can be more surely obtained.

Furthermore, the upper insulating layer 22a and the surface insulating layer 22 can be formed using the same resin in the same one step, and therefore the semiconductor wafer 1 can be easily manufactured.

Method of Manufacturing Laminated Chip Package, and Structures of Laminated Chip Package and Device Plate By using a plurality of the same kind of semiconductor wafers 1 having the above-described structure, a laminated chip package 100 can be manufactured. The method of manufacturing the laminated chip package 100 will be described using FIG. 19 to FIG. 22 as follows.

Figure 19:
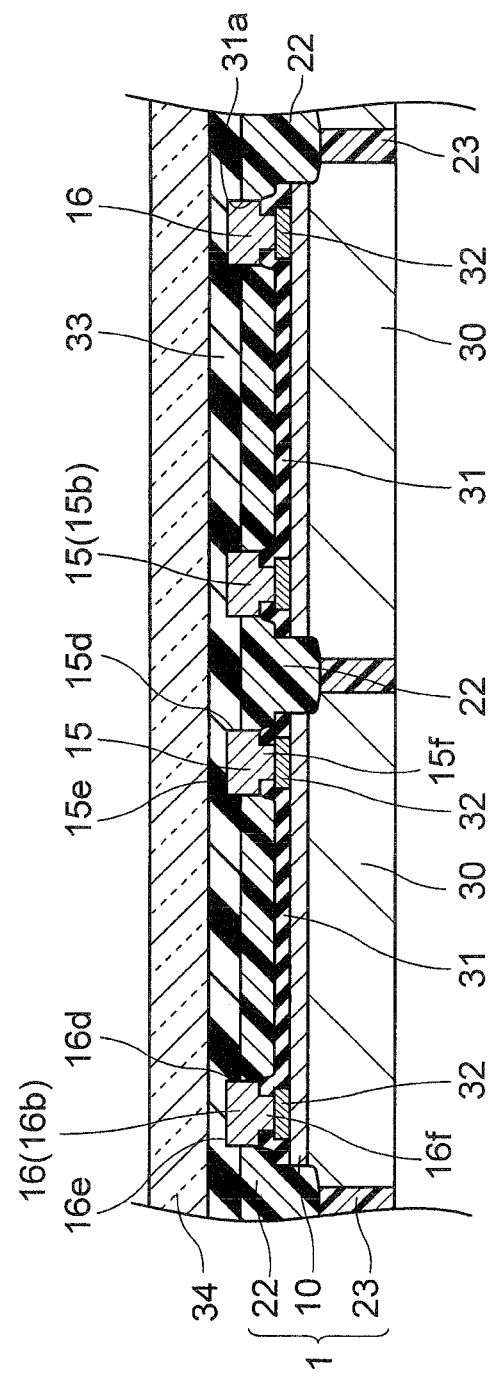
FIG. 19 is a sectional view similar to FIG. 3, illustrating the semiconductor wafer in the process of manufacturing a laminated chip package and a base.
Figure 20:
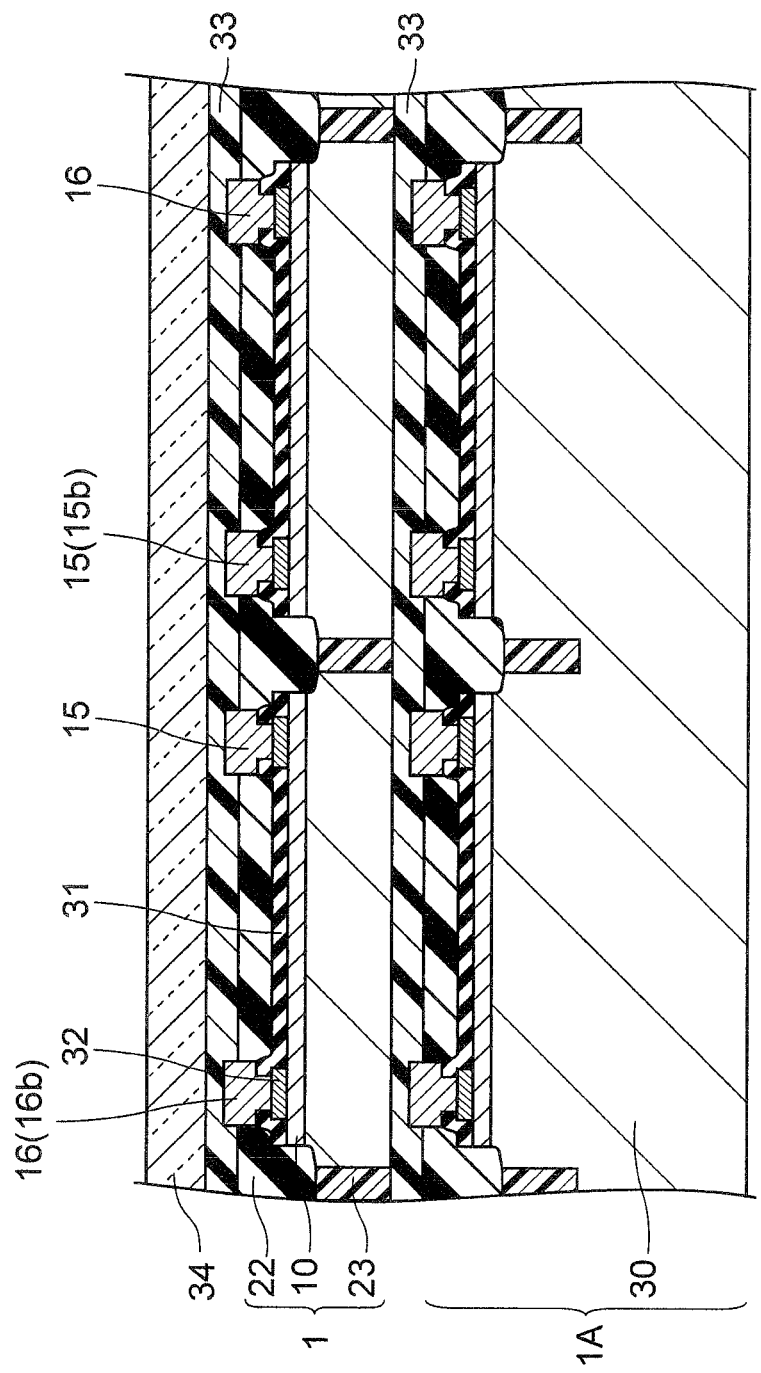
FIG. 20 is a sectional view similar to FIG. 3, illustrating the process subsequent to that in FIG. 19.

Here, FIG. 19 is a sectional view similar to FIG. 3, illustrating the semiconductor wafer 1 in the process of manufacturing the laminated chip package 100 and a base 34. FIG. 20 is a sectional view similar to FIG. 3, illustrating the process subsequent to that in FIG. 12, FIG. 21 is a sectional view similar to FIG. 3, illustrating the process subsequent to that in FIG. 20, and FIG. 22 is a sectional view similar to FIG. 3, illustrating the process subsequent to that in FIG. 21.

The laminated chop package 100 is manufactured as follows. First, an adhesive is applied on the first surface 1a of the above-described semiconductor wafer 1 to fix it to the base 34. In FIG. 19, the adhesive layer 33 made of the adhesive applied at this time is shown. The semiconductor wafer 1 is used as the uppermost substrate disposed at the uppermost position of a later-described laminated device wafer 98. The base 34 is a member for supporting the semiconductor wafer 1, and a glass plate is used for the base 34 in FIG. 19. Subsequently, the second surface 1b of the semiconductor wafer 1 is polished until the groove portions 20 and 21 appear so that the thickness of the semiconductor wafer 1 is decreased as illustrated in FIG. 19.

Next, another semiconductor wafer 1A having the same structure as that of the semiconductor wafer 1 is prepared and bonded to the second surface 1b side of the semiconductor wafer 1 as illustrated in FIG. 20 using an adhesive. In this event, position adjustment of the semiconductor wafer 1 and the semiconductor wafer 1A is performed such that the positions of the groove portions 20 and 21 of both of them coincide with each other. Then, the second surface 1b of the semiconductor wafer 1A is polished until the groove portions 20 and 21 appear. This polish decreases the thickness of the semiconductor wafer 1A to thereby obtain a laminated device wafer. In the laminated device wafer, a plurality of semiconductor wafers 1 are laminated.

Figure 21:
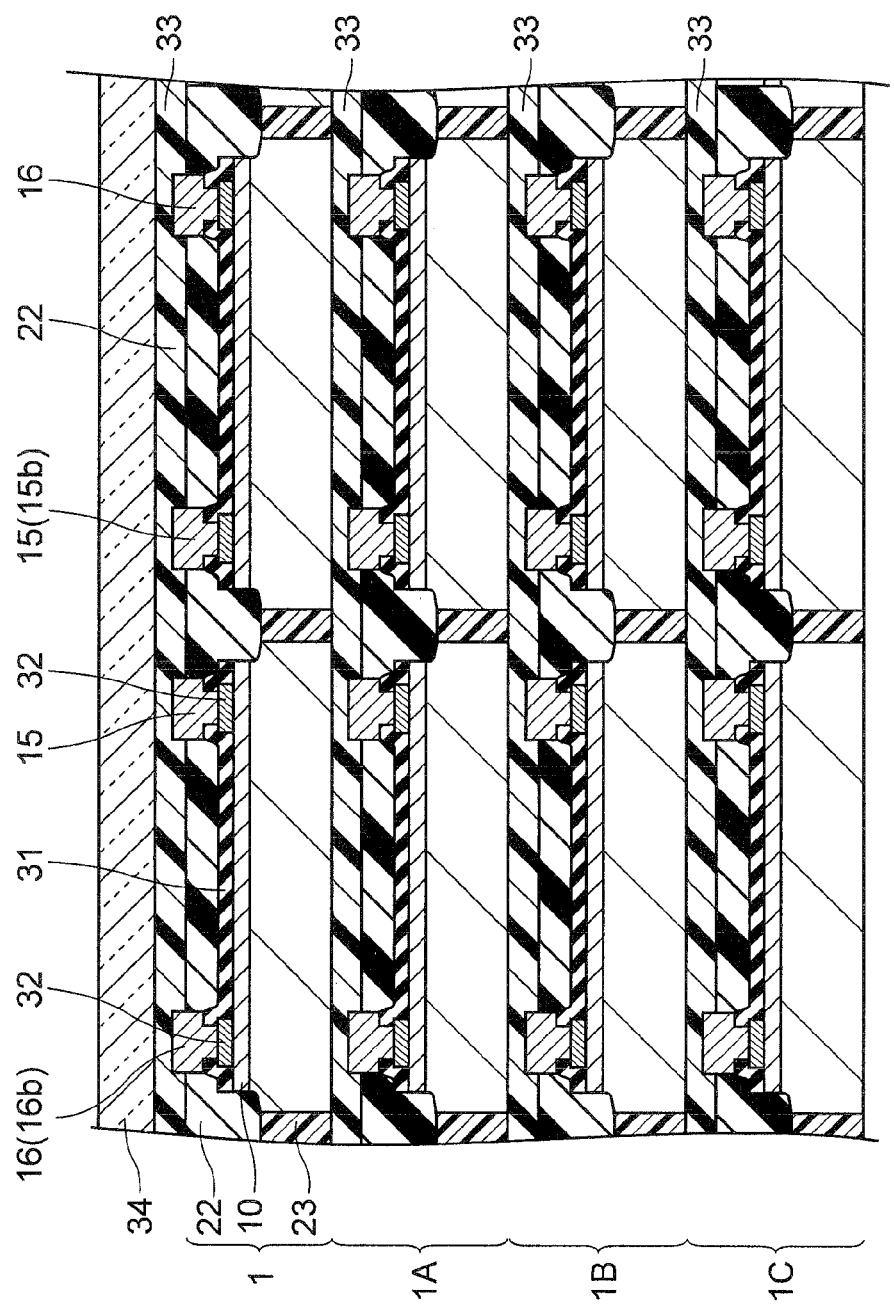
FIG. 21 is a sectional view similar to FIG. 3, illustrating the process subsequent to that in FIG. 20.
Figure 22:
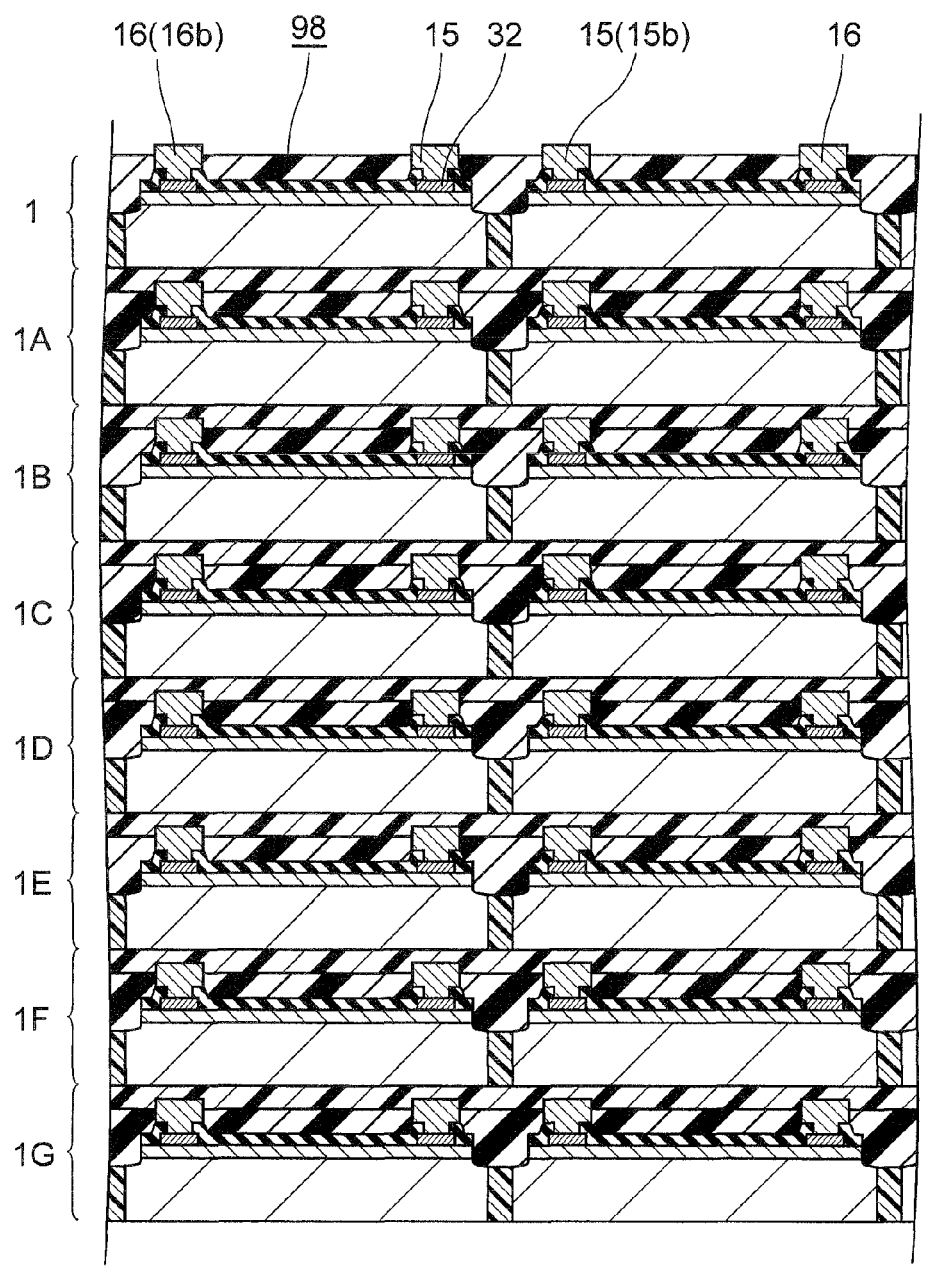
FIG. 22 is a sectional view similar to FIG. 3, illustrating the process subsequent to that in FIG. 21.

Further, as illustrated in FIG. 21, other semiconductor wafers 1B and 1C having the same structure as that of the semiconductor wafer 1 are prepared. Then, for each of the semiconductor wafers 1B and 1C, a process of bonding it to the second surface 1b side of the laminated device wafer and polishing it (a bonding and polishing process) is performed.

Continuously, the bonding and polishing process is repeatedly performed and then the base 34 and the adhesive layer 33 are removed, whereby the laminated device wafer 98 as illustrated in FIG. 22 is manufactured. In the laminated device wafer 98, the semiconductor wafer 1 and the semiconductor wafers 1A, 1B, 1C, 1D, 1E, 1F, and 1G are stacked so that eight semiconductor wafers in total are laminated. In this laminated device wafer 98, the base 34 and the adhesive layer 33 have been removed therefrom, and therefore the wiring electrodes 15 and 16 of the semiconductor wafer 1 appear in a protruding shape.

Figure 24:
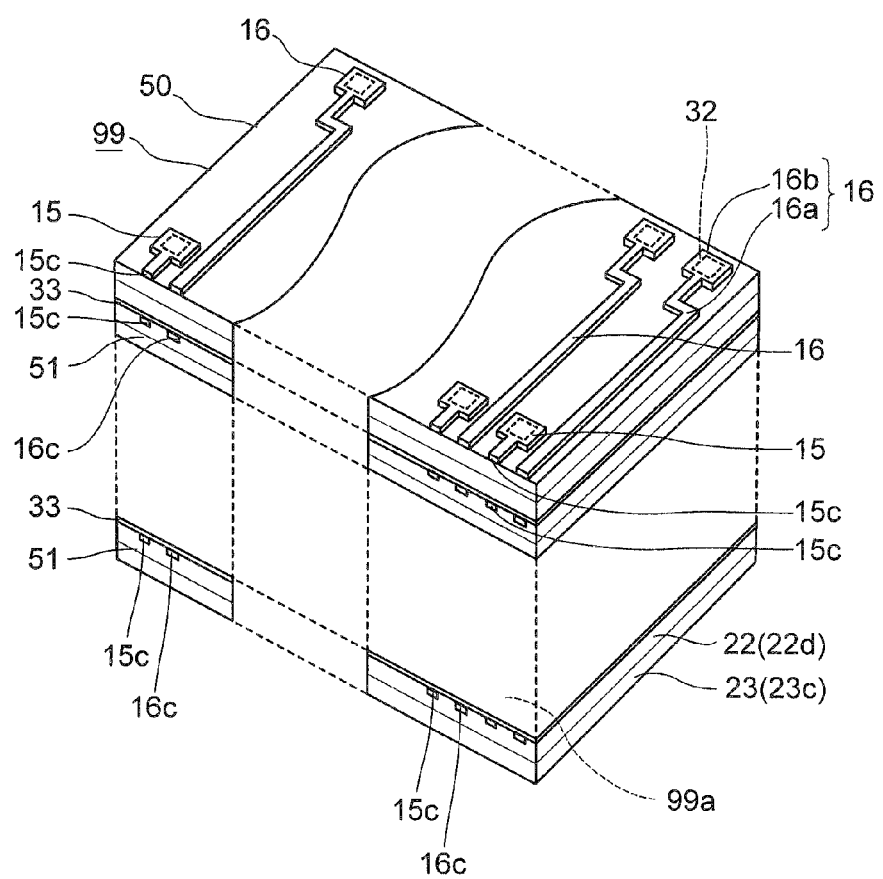
FIG. 24 is a perspective view illustrating an example of a device block.

Subsequently, the laminated device wafer 98 is cut along the groove portions 20 and 21. Thus, a device block 99 in a rectangular parallelepiped shape is obtained as illustrated in FIG. 24. FIG. 24 is a perspective view illustrating the device block 99. One of four side surfaces of the device block 99 is a wiring side surface 99a. At the wiring side surface 99a, later-described end faces 15c and 16c of the extended terminal portions 15a and 16a appear to project outward from the surface 22c of the surface insulating layer 22.

On the other hand, when cutting the laminated device wafer 98 along the groove portions 20 and 21, the groove portions 20 and 21 are cut along the cut lines CL as illustrated in FIG. 6. Then, the extended terminal portions 16a (also the extended terminal portions 15a) are cut along the cut lines CL. Further, as described above, the insulating layer of the double-layer structure has been formed inside the groove portions 20 and 21 in each semiconductor wafer 1. Therefore, the section of the insulating layer of the double-layer structure (the section of the insulating layer is referred also to as an "insulating section") appears in a cut surface when the laminated device wafer 98 is cut along the groove portions 20 and 21. The insulating section is in the double-layer structure in which an insulating section 22d that is the section of the upper insulating layer 22a is laminated on an insulating section 23c that is the section of the lower insulating layer 23.

Figure 34:
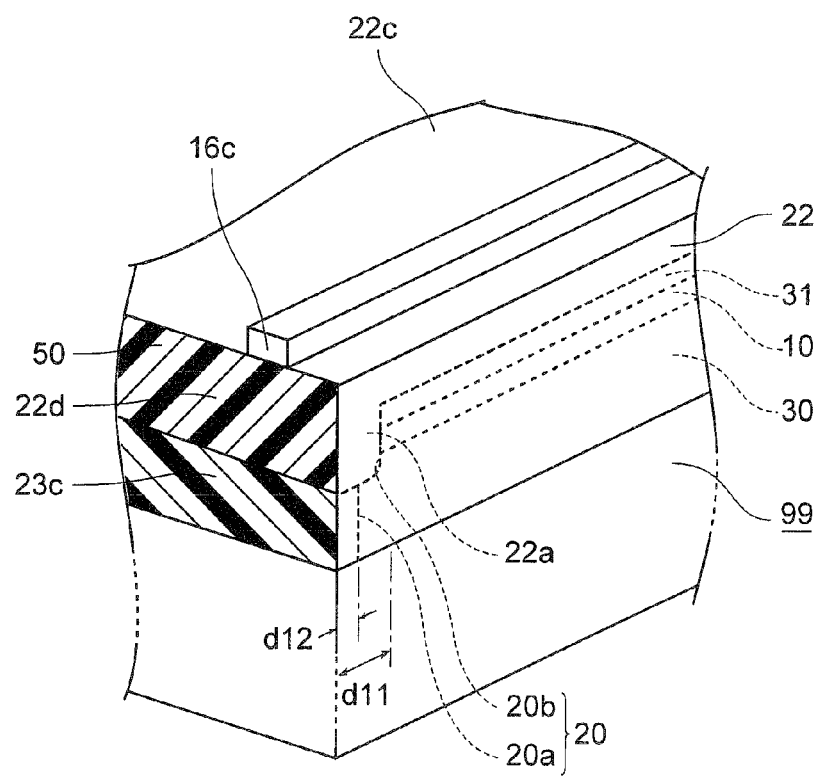
FIG. 34 is a perspective view showing a section of one side surface of an essential portion of a corner portion in the device block and the other side surface together with the internal structure.

Further, the wide width portions 20b and 21b are formed wider than the groove lower portions 20a and 21a in each semiconductor wafer 1. Therefore, the upper insulating layer 22a has a depth larger than that of the lower insulating layer 23 at four side surfaces of the device block 99. This depth means a distance d11 between the insulating section 22d and the inner side surface of the wide width portion 20b (21b) and a distance d12 between the insulating section 23c and the inner side surface of the groove lower portion 20a (21a) in the device block 99 (also in the laminated chip packaged 100 and later-described device plates 50 and 51) as illustrated in FIG. 6 and FIG. 34. The distance d11 is larger than the distance d12 and therefore d11>d12.

Figure 25:
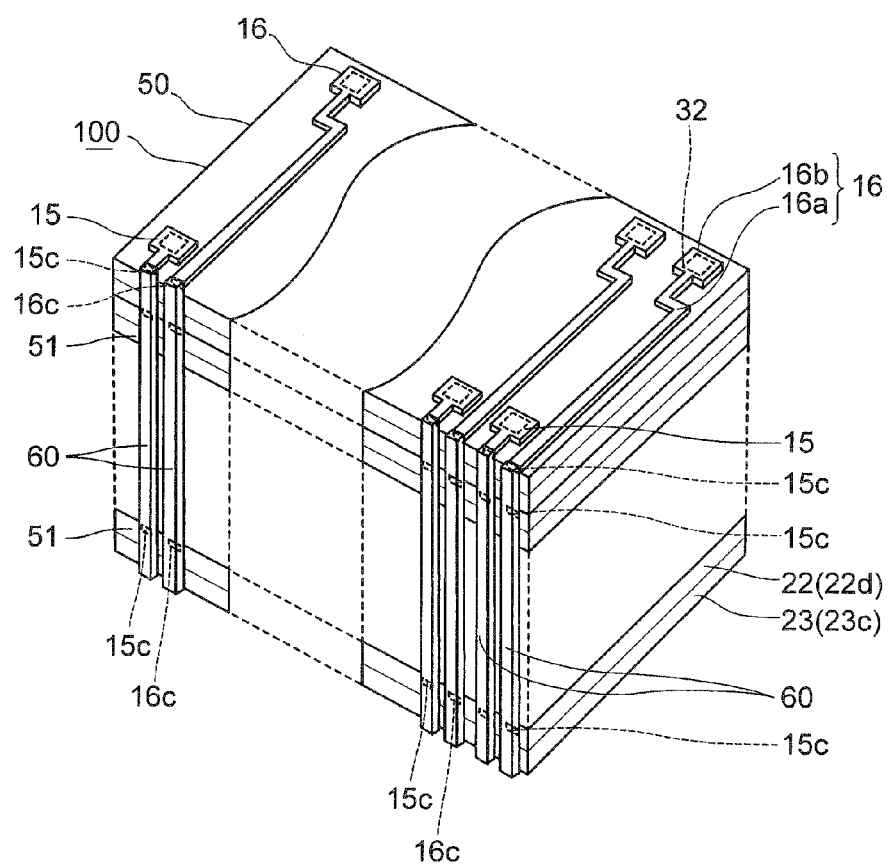
FIG. 25 is a perspective view illustrating an example of the laminated chip package with a part thereof omitted.

Subsequently, by forming connection electrodes 60 on the wiring side surface 99a as illustrated in FIG. 25, the laminated chip package 100 is manufactured. The connection electrodes 60 are formed in a band shape to connect the plural vertically arranged end faces 15c or the plural vertically arranged end faces 16c.

Figure 26:
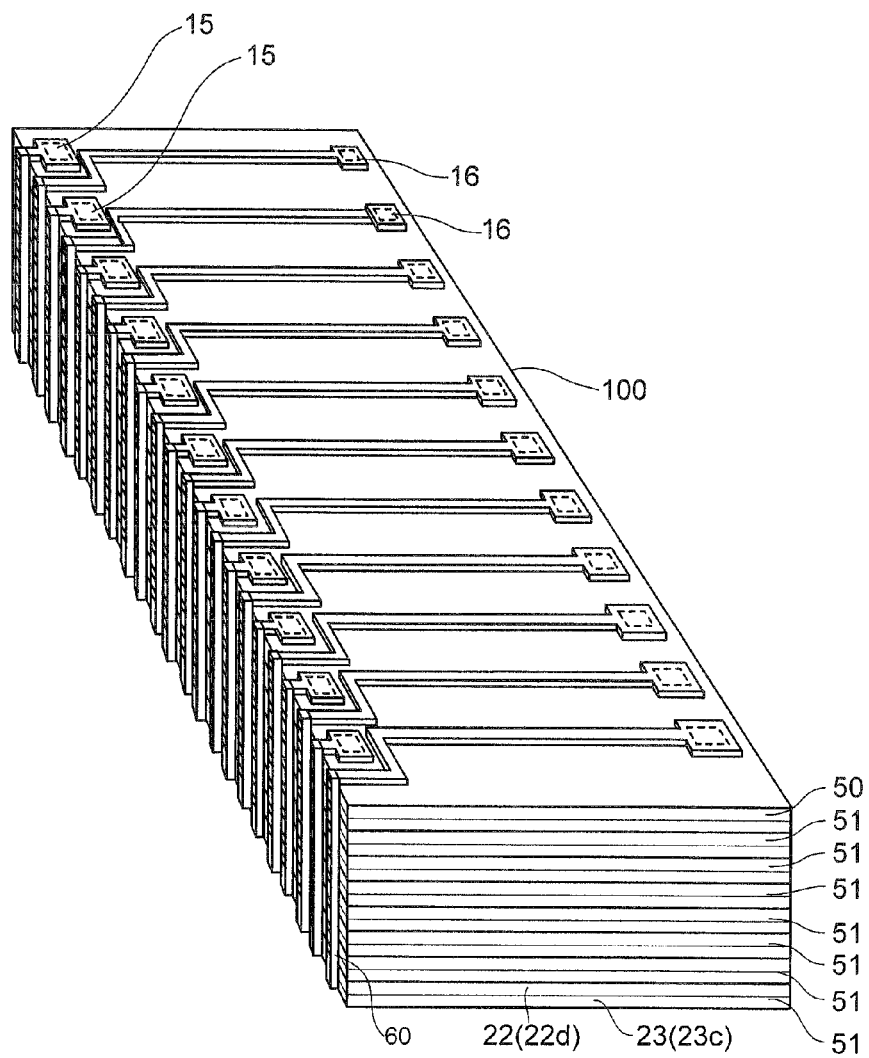
FIG. 26 is a perspective view illustrating an example of the same laminated chip package with FIG. 25.

The laminated chip package 100 has a structure in which one device plate 50 and seven device plates 51 are stacked so that eight device plates in total are laminated as shown in FIG. 25 as well as FIG. 26.

Further, in the laminated chip package 100, wiring of the device plates 50 and 51 is realized by the connection electrodes 60. In the laminated chip package 100, all of the connection electrodes 60 are formed on the wiring side surface 99a that is one of four side surfaces. This realizes the single-side wiring structure in the laminated chip package 100. In the laminated chip package 100, a plurality of end faces 15c and a plurality of end faces 16c are formed, and the connection electrodes 60 are formed in a manner to respectively connect them in the vertical direction.

The laminated chip package 100 can realize memories with various storage capacities such as 64 GB (gigabyte), 128 GB, and 256 GB by varying the memory portions in the semiconductor wafer 1. Note that eight device plates are laminated in the laminated chip package 100. However, it is only necessary that a plurality of device plates are laminated, and the number of the laminated device plates is not limited to eight.

The laminated chip package 100 is manufactured by forming the connection electrodes 60 on the wiring side surface 99a. The end faces 15c and 16c connected by the connection electrodes 60 are formed in a manner to project upward from the surface 22c.

At the time of forming the connection electrodes 60, the mask pattern for forming the connection electrodes 60 needs to be accurately placed, but the laminated chip package 100 can be manufactured even if the position adjustment of the mask pattern is roughly performed. Even with the rough position adjustment, the connection electrodes 60 connecting the vertically arranged plural end faces 15c or the vertically arranged plural end faces 16c can be formed.

More specifically, in the laminated chip package 100, the alignment does not need to be performed with high accuracy when forming the connection electrodes 60. Therefore, the process after the device block 99 in the rectangular parallelepiped shape is obtained can be simplified, thereby simplifying the whole manufacturing process of the laminated chip package 100. Accordingly, the manufacturing time of the laminated chip package 100 can be reduced. This can increase the number of laminated chip packages 100 manufacturable in a unit time, resulting in a reduced manufacturing cost of the laminated chip package 100.

The reason why the alignment does not need to be performed with high accuracy in case of forming the connection electrodes 60 is given as follows.

First of all, the device block 99 has four side surfaces composed of cut surfaces when the laminated device wafer 98 is cut. In one of the cut surfaces, the end faces 15c and 16c appear as end faces projecting similarly to the end faces 15g and 16g (see FIG. 5 for details). This is because of the following reason. Note that the end face projecting is also referred to as a projecting end face in this embodiment.

The wiring electrodes 15 and 16 of each of the semiconductor wafers 1 (also the semiconductor wafer 1A, 1B, 1C, 1D, 1E, 1F, 1G) have the extended terminal portions 15a and the extended terminal portions 16a respectively. The extended terminal portions 15a and the extended terminal portions 16a are extended inside the groove portions 20. For this reason, when the laminated device wafer 98 is cut along the groove portions 20 and 21, the extended terminal portions 15a and the extended terminal portions 16a are also cut. Further, the end faces 15c and 16c formed when the extended terminal portions 15a and the extended terminal portions 16a are cut appear at one of the cut surfaces.

On the other hand, the extended terminal portions 15a and 16a are formed in the protruding shape similarly to the electrode pads 15b and 16b having the expanded height h15. Therefore, the end faces 15c and 16c appear as projecting end faces projecting upward from the surface 22c.

For the connecting pads 32, a case where terminal portions extending to the inside of the groove portion 20 are formed is discussed here (the terminal portions are referred to as virtual terminal portions). In this case, end faces of the virtual terminal portions will appear at the side surface of the device block.

However, the extended terminal portions 15a and 16a have top end faces 15e and 16e common with the electrode pads 15b and 16b having the expanded height h15 and are formed to be larger in thickness than the connecting pads 32. For this reason, the end faces 15c and 16c will appear having a larger size than the end faces of the above-described virtual terminal portions. In the device block 99, the end faces 15c and 16c having such a large size appear arranged in the vertical direction, so that the end faces 15c are easily connected to each other and the end faces 16c are also easily connected to each other. It is only necessary for the connection electrodes 60 to connect the end faces 15c or the end faces 16c. Therefore, the position adjustment of the mask pattern may be roughly performed at the time when the connection electrodes 60 are formed. For this reason, in the device block 99, the alignment does not need to be performed with high accuracy in case of forming the connection electrodes 60.

Besides, the large size of the end faces 15c and 16c means that the sectional areas of the wiring electrodes 15 and 16 have been expanded. Accordingly, the resistance values of the wiring electrodes 15 and 16 can be decreased. This causes the current flowing through the wiring electrodes 15 and 16 to easily flow, so that the power consumption of the laminated chip package 100 can also be reduced.

Thus, the semiconductor wafer 1 has the wiring electrodes 15 and 16 as described above, whereby the manufacturing process of the laminated chip package 100 can be simplified to reduce the manufacturing time.

Further, the device block 99 has the electrode pads 15b and 16b rising above in the protruding shape appearing at its upper surface. When pad-like terminals rising above the surface of the insulating layer are required, the laminated chip package needs to be manufactured by stacking the terminal layer including such pad-like terminals (such a terminal layer is an interposer having no semiconductor device).

However, in the device block 99, the device plate 50 having the electrode pads 15b and 16b rising above in the protruding shape is laminated at the uppermost position. Therefore, it is unnecessary to stack the interposer. Therefore, the terminal layer is not necessary, so that the laminated chip package 100 has a compact structure with an accordingly smaller height.

Further, because the semiconductor wafer 1 has the extended terminal portions 15a and 16a extending inside of the groove portions 20, the end faces 15c and 16c can appear at the cut surfaces when the laminated device wafer is cut along the groove portions 20. In other words, by cutting the laminated device wafer 98, in which the semiconductor wafers 1 are laminated, along the groove portions 20, the end faces 15c and 16c can be obtained.

Therefore, in case of using the semiconductor wafer 1, it is unnecessary to separately provide another process in order to make the wirings connecting to the device regions 10 appear at the cut surfaces. If the wiring electrodes 15 and 16 do not have the extended terminal portions 15a and 16a, the wiring electrodes 15 and 16 cannot be cut even by cutting the laminated device wafer along the groove portions 20. Therefore, only by cutting the laminate device wafer along the groove portions, the wirings connecting to the device regions 10 cannot be made to appear at the cut surfaces. Thus, in order to make such wirings appear at the cut surfaces, another process needs to be performed.

In contrast, in the case of using the semiconductor wafer 1, the end faces of the wiring electrodes 15 and 16 can be made to appear at the cut surfaces when the laminated device wafer is cut along the groove portions, and therefore it is unnecessary to separately perform a process for making the wirings appear at the cut surfaces. Consequently, the manufacturing process of the laminated chip package can be further simplified by using the semiconductor wafer 1.

Further, the wiring electrodes 15 and 16 are formed to rise above the surface insulating layer 22. Therefore, when the end faces 15c and 16c appear at the cut surface, the end faces 15c located one above the other are arranged via the surface insulating layer 22 and the end faces 16c located one above the other are arranged via the surface insulating layer 22. Accordingly, a situation that the device plates located one on the other short-circuit can be prevented.

Further, the wiring electrodes 15 and 16 in the semiconductor wafer 1 form the wiring electrode group 17, and the wiring electrode group 17 has an unevenly distributed structure in which the wiring electrodes 15 and 16 are unevenly distributed at a part of the groove portions 20 and 21 which are in contact with the device region 10. This ensures that when the laminated chip package 100 is manufactured using the semiconductor wafer 1, the wiring connecting to the device region 10 can be placed closely to a single side surface to realize the single side surface wiring of the laminated chip package 100.

Consequently, the semiconductor wafer 1 is suitable for manufacturing the laminated chip package 100 which can realize the single side surface wiring. Further, an inspection to examine presence or absence of a defective chip needs to be performed only on part of the cut surfaces of the semiconductor wafer 1. Accordingly, the process of manufacturing the laminated chip package could be further simplified by using the semiconductor wafer 1.

In addition, because the extended terminal portions 15a and 16a have a narrow-width structure having narrower widths than those of the electrode pads 15b and 16b, many wiring electrodes 15 and 16 can be arranged in the device region 10. Accordingly, the wiring density of the wiring electrodes 15 and 16 can be increased in the semiconductor wafer 1. Furthermore, the memory portions of each device region 10 are formed on the same plane in the semiconductor wafer 1, so that the alignment error is 0 (zero).

Meanwhile, the device block 99 has a structure that the device plate 51 illustrated in FIG. 24 is laminated under the device plate 50 illustrated in FIG. 23.

In the device block 99, the end faces 15c and 16c appear at the wiring side surface 99a being one of the side surfaces of the device block 99. The wiring side surface 99a is a cut surface when the laminated device wafer 98 is cut along the groove portions 20 and 21.

The device plate 50 is a first semiconductor plate according to the embodiment of the present invention and is formed as a whole in a thin rectangular plate shape as illustrated in FIG. 23, and its four side surfaces are covered by the insulating layer.

This insulating layer has the double-layer structure as in the above-described device block 99 and laminated chip package 100. More specifically, the device plate 50 is covered by the insulating layer of the double-layer structure in which the upper insulating layer 22a is laminated on the lower insulating layer 23 as illustrated in FIG. 34. Further, the upper insulating layer 22a has a larger depth than that of the lower insulating layer 23 at four side surfaces of the device plate 50. Thus, the device plate 50 has a structure that is apparently formed using the above-described semiconductor wafer 1.

Further, in the device plate 50, the flat surface on one side is the surface 22c of the surface insulating layer 22, and the plural three-dimensional wiring electrodes 15 and three-dimensional wring electrodes 16 rising above the surface 22c are formed. The end faces 15c and 16c of the wiring electrodes 15 and the wiring electrodes 16 appear as projecting end faces at a side surface 50A being one of the four side surfaces. The end faces 15c and 16c are first projecting end faces and can be connected to the connection electrodes 60. The surface insulating layer 22 of the device plate 50 constitutes its own surface layer, and constitutes the surface layer of the laminated chip package 100.

The device plate 51 is a second semiconductor plate according to this embodiment of the present invention. The device plate 51 is different from the device plate 50 in that the device plate 51 has the adhesive layer 33 covering the surface 22c and the wiring electrodes 15 and the wiring electrodes 16. The device plate 51 has the same structure as that of the device plate 50 in other points. In the device plate 51, the end faces 15c and 16c of the wiring electrodes 15 and the wiring electrodes 16 are formed as projecting end faces projecting outward from the surface 22c of the surface insulating layer 22 below the end faces 15c and 16c of the device plate 50. Further, the device plate 51 is laminated under the device plate 50 via the adhesive layer 33.

The above laminated chip package 100 is manufactured by laminating the semiconductor wafers 1. Therefore, the wiring electrodes 15 and 16 of the device plates 50 and 51 are surely supported by the surface insulating layers 22, the upper insulating layers 22a and the lower insulating layers 23, and are never deformed due to bending downward.

Because there is no deformation of the wiring electrodes 15 and 16 in the laminated chip package 100, the end faces 15c and 16c of the wiring electrodes 15 and 16 surely appear at determined positions having determined sizes in the device plates 50 and 51. If the extended terminal portions 15a and 16a are deformed due to bending downward, their angles with respect to the side surface 50A may change to cause an insufficient contact between the end faces 15c, 16c and the connection electrodes 60. However, there is no such possibility in the laminated chip package 100 and the device plates 50 and 51.

Accordingly, the end faces 15c of the device plates 50 and 51 can be surely connected with each other by the connection electrodes 60 and the end faces 16c can be surely connected with each other by the connection electrodes 60 in the laminated chip package 100. Therefore, the laminated chip package 100 has a very high reliability of electrical connection. By manufacturing the laminated chip package 100 using the semiconductor wafer 1 as describe above, the reliability of electrical connection of the laminated chip package 100 can be enhanced.

Second Embodiment

Structure of Semiconductor Wafer

Figure 27:
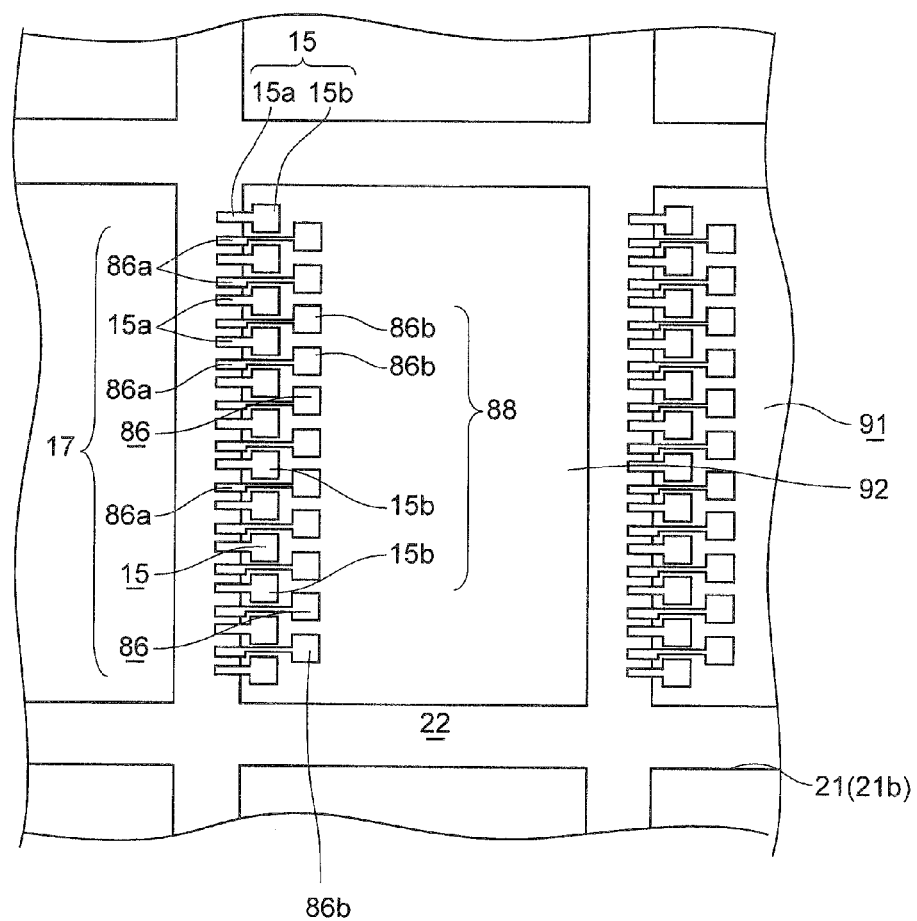
FIG. 27 is a plan view illustrating a device region and a region surrounding it formed in a semiconductor wafer according to a second embodiment of the present invention.

To begin with, the structure of a semiconductor wafer 91 according to the second embodiment of the present invention will be described with reference to FIG. 27.

The semiconductor wafer 91 according to this embodiment is different in that it has a device region 92 in place of the device region 10 and that it has wiring electrodes 86 in place of the wiring electrodes 16 as compared with the semiconductor wafer 1.

The device region 92 is different from the device region 10 in that the wiring electrodes 86 are formed as well as the wiring electrodes 15.

The wiring electrode 86 is made of a conductive material such as Cu or the like; and has an extended terminal portion 86a and a rectangular electrode pad 86b. The extended terminal portion 86a and the electrode pad 86b of the wiring electrode 86 are formed along a part of the outer periphery of the device region 92, similarly to the wiring electrode 15. Thus, in the device region 92, the wiring electrodes 15 and 86 form the same wiring electrode group 17 as in the device region 10, and additionally, all of their electrode pads 15b and 86b are gathered to a single side of the device region 92. In such a manner, the wiring electrodes 15 and 86 form a gathered pad group 88 in the device region 92.

In the semiconductor wafer 1 according to the first embodiment, the extended terminal portion 16a of the wiring electrode 16 is formed across the device region 10. Therefore, a certain length of the extended terminal portion 16a needs to be secured in the semiconductor wafer 1.

On the other hand, in the semiconductor wafer 91, the extended terminal portions 86a are formed along a part of the outer periphery of the device region 92, so that the length of the extended terminal portion 86a can be made smaller than that of the extended terminal portion 16a. In the semiconductor wafer 91, the length of the extended terminal portion 86a is reduced to allow more quick access to the device region 92. Further, the amount of plating or the like required for forming the wiring electrodes 86 can be reduced as compared to the case of forming the wiring electrodes 16, resulting in a reduced cost.

In addition, the semiconductor wafer 91 can be used to simplify the manufacturing process of the laminated chip package which can realize the single side surface wiring, as with the semiconductor wafer 1.

Figure 31:
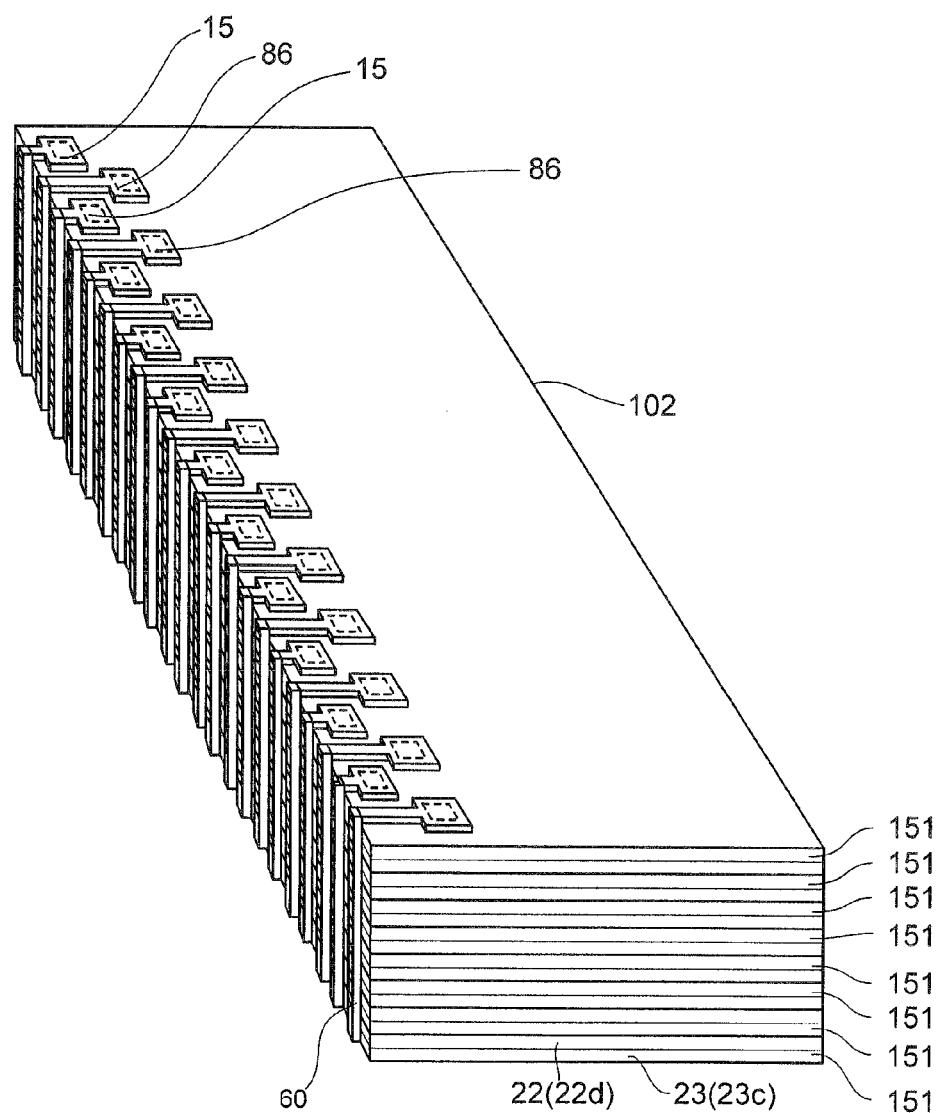
FIG. 31 is a perspective view illustrating another laminated chip package.

Further, it is possible to manufacture device plates 151 which are similar to the device plate 50 using the semiconductor wafer 91, and laminate the eight device plates 151 one on the other to thereby manufacture a laminated chip package 102 as illustrated in FIG. 31.

Method of Manufacturing Semiconductor Wafer

The manufacture of the semiconductor wafer 91 is performed similarly to the manufacture of the semiconductor wafer 1 before the formation of the wiring electrodes 15 and 86. Thereafter, the wiring electrodes 15 and 86 are formed in shapes including the above-described extended terminal portions 15a and 86a. The wiring electrodes 15 and 86 can be formed by the procedure similar to that of the semiconductor wafer 1.

Other Embodiments

Figure 28:
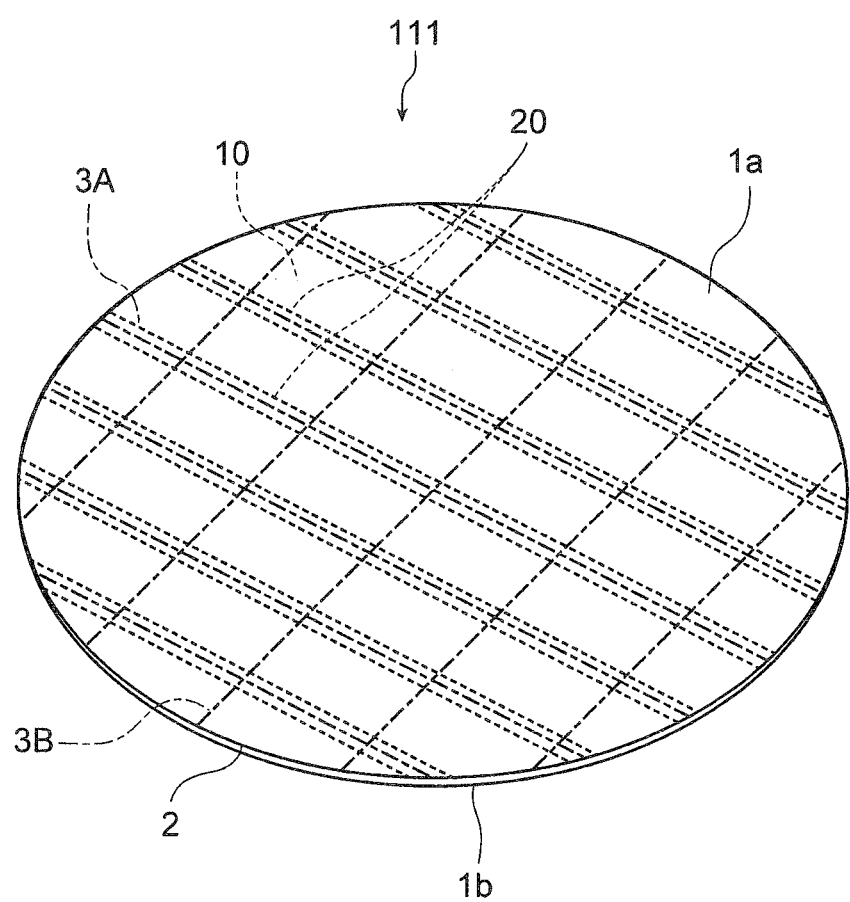
FIG. 28 is a perspective view illustrating the entire semiconductor wafer according to another embodiment of the present invention.
Figure 29:
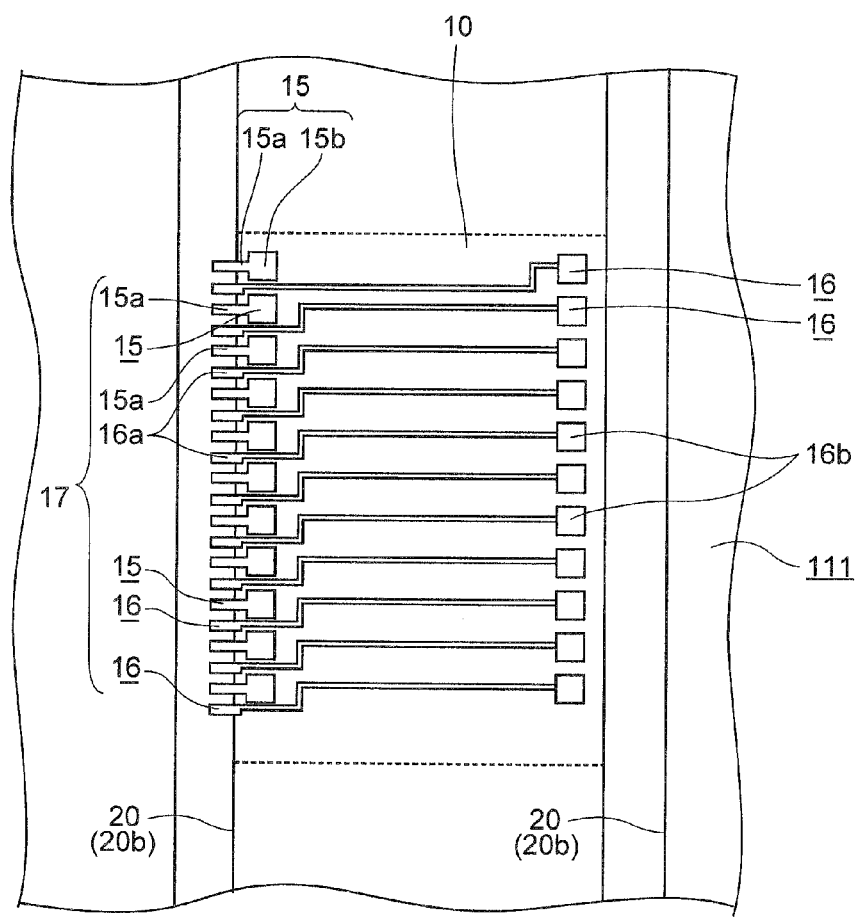
FIG. 29 is a plan view illustrating a device region and a region surrounding it formed in the semiconductor wafer in FIG. 28.

A semiconductor wafer 111 will be described with reference to FIG. 28 and FIG. 29. In the semiconductor wafer 1 according to the first embodiment, the groove portions 20 and 21 are formed. The semiconductor wafer 111 is different from the semiconductor wafer 1 in that groove portions 21 are not formed but only groove portions 20 are formed. Accordingly, the semiconductor wafer 111 is formed such that a plurality of groove portions 20 are arranged at regular intervals and the groove portions are formed in the shape of stripes not intersecting with each other.

Figure 30:
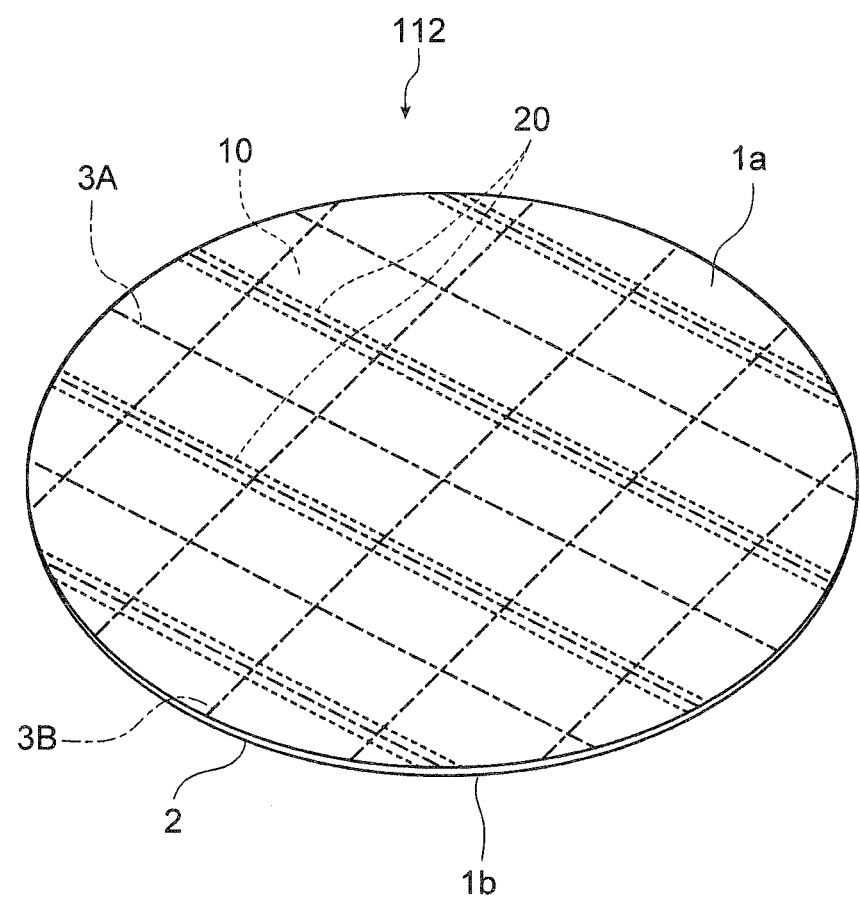
FIG. 30 is a perspective view illustrating the entire semiconductor wafer according to still another embodiment of the present invention.

Next, a semiconductor wafer 112 illustrated in FIG. 30 is the same as the semiconductor wafer 111 in that only groove portions 20 are formed, but the groove portion 20 is formed along every other scribe line 3A.

In the semiconductor wafer 1, the device region 10 is in contact with the four groove portions 20 and 21, so that the device region 10 is in contact with the groove portions 20 and 21 in the four directions, that is, upper, lower, right and left directions. Accordingly, as illustrated in FIG. 23, the device plate 50 manufactured from the semiconductor wafer 1 is covered by an insulating layer of double-layer structure at the four side surfaces.

Figure 32:
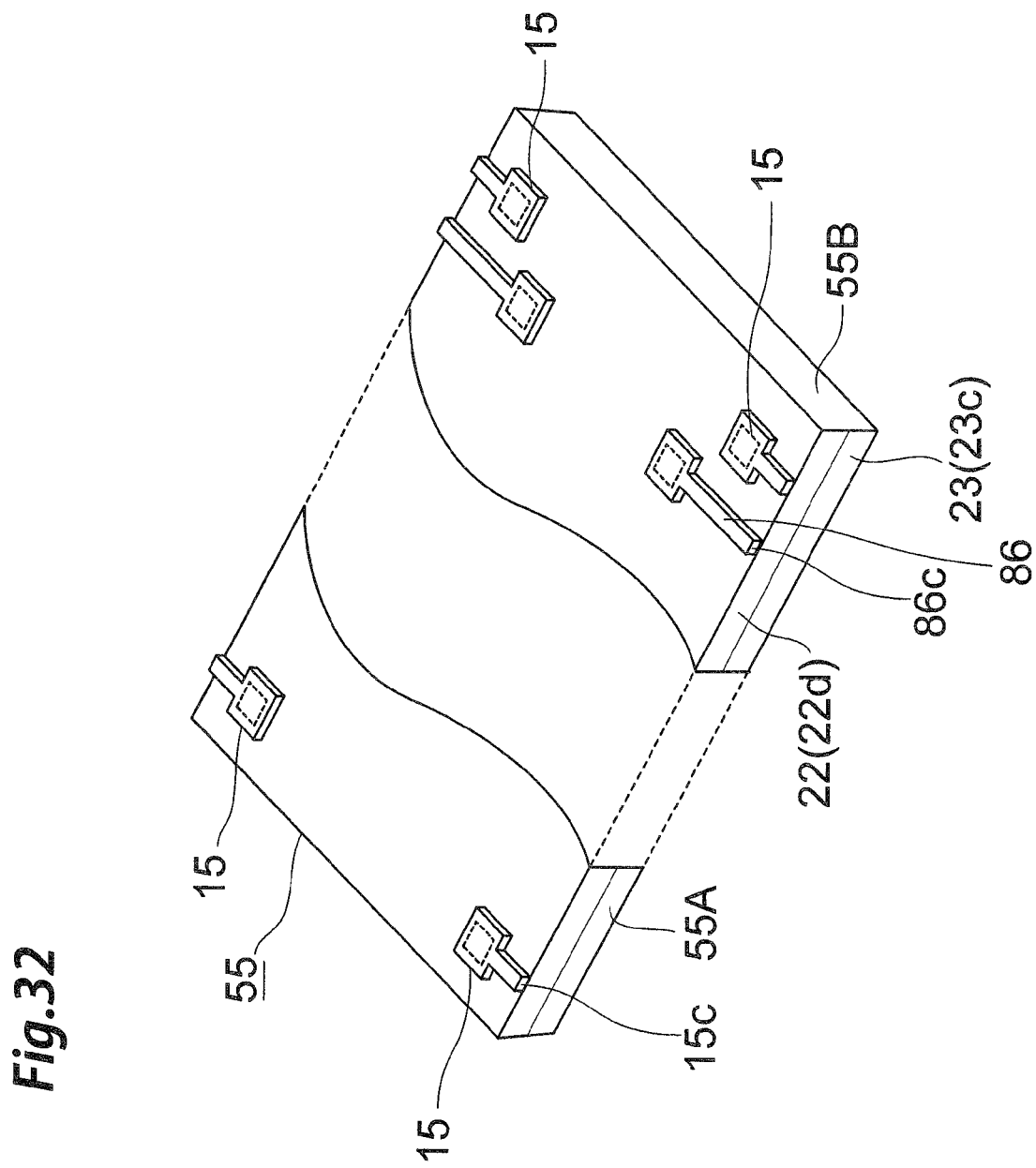
FIG. 32 is a perspective view illustrating another device plate.

In contrast, in the semiconductor wafer 111, the device region 10 is in contact with the groove portions 20 only in the two, that is, right and left directions. Accordingly, a device plate 55 using the semiconductor wafer in which the groove portions are formed in the shape of stripes as in the semiconductor wafer 111 is as illustrated in FIG. 32. The device plate 55 has two sets of opposite side surfaces, that is, a side surface 55A and a side opposite thereto and a side surface 55B and a side opposite thereto, which are structured such that only the side surface 55A and the side opposite thereto are covered by the insulating layer of double-layer structure but the side surface 55B and the side opposite thereto are not covered by the insulating layer of double-layer structure.

Further, the device plate 55 is formed such that the wiring end faces 15c and 86c of the wiring electrodes 15 and 86 are formed in both of two opposite side surfaces 55A. Though not illustrated, when the device plates 55 are laminated, the laminated chip package can be obtained by forming connection electrodes on the opposite two side surfaces. This laminated chip package has a both-side wiring structure in which the connection electrodes are formed on both of the opposite faces.

In the semiconductor wafer 112, the device region 10 is in contact with the groove portion 20 only in any one of right and left directions. Therefore, when the semiconductor wafer in which the groove portion is formed along every other scribe line as in the semiconductor wafer 112 is used, the end faces of the wiring electrodes and the insulating layer of double-layer structure appear only one of the side surfaces in the device plate. The other side surfaces are not covered by the insulating layer of double-layer structure.

Figure 35:
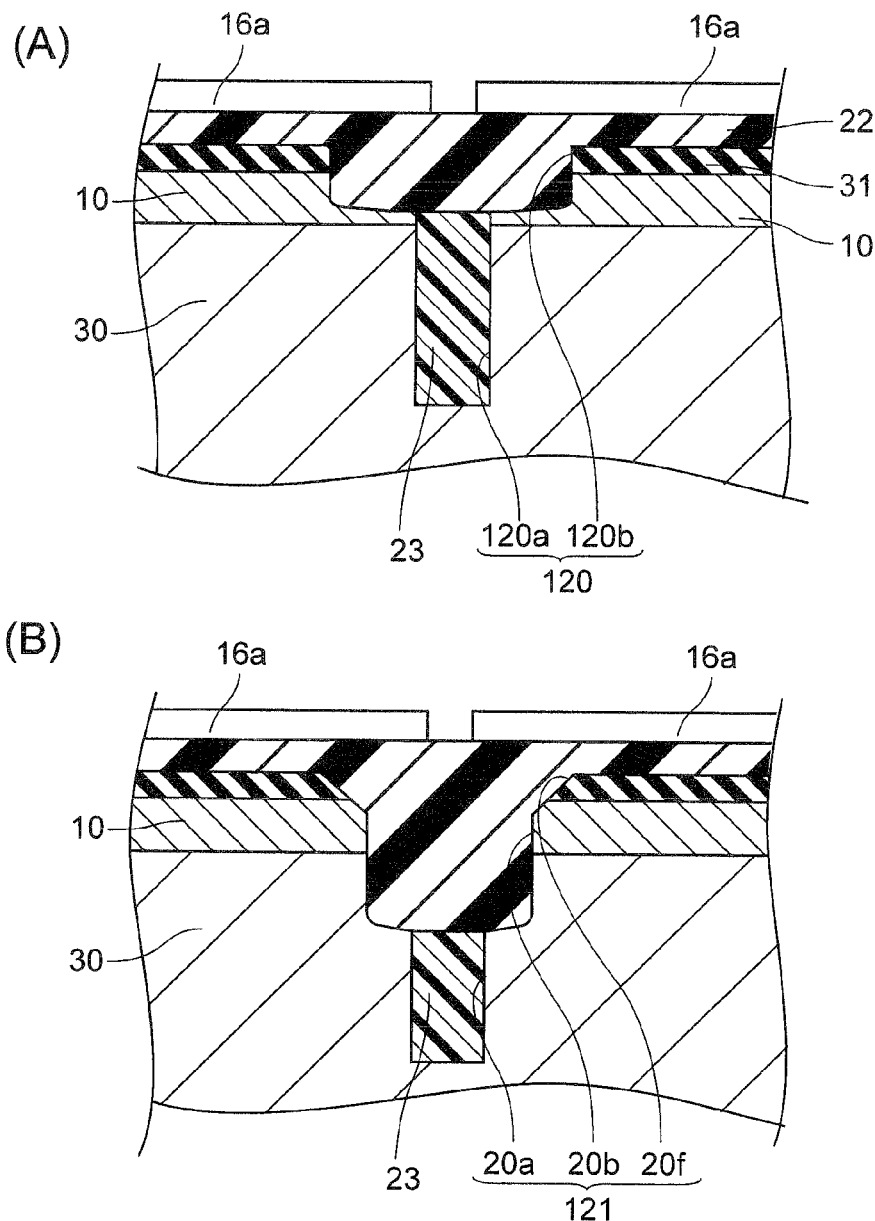
FIG. 35(A) is a sectional view similar to FIG. 6 according to a modified example, and (B) is a sectional view similar to FIG. 6 according to another modified example.

On the other hand, in the above-described semiconductor wafer 1, though the wide width portions 20b and 21b of the groove portions 20 and 21 are formed having depths similar to those of the groove lower portions 20a and 21a, groove portions 120 may be formed in place of the groove portions 20 as illustrate in FIG. 35(A). The groove portion 120 is different from the groove portion 20 in that it has a groove lower portion 120a and a wide width portion 120b. The groove lower portion 120a is different from the groove lower portion 20a in that it is deeper in depth than the groove lower portion 20a. The wide width portion 120b is different from the wide width portion 20b in that it is shallower in depth than the wide width portion 20b.

Even though the wide width portion 120b has a shallower depth than that of the groove lower portion 120a, the resin easily enters the inside of the groove portion 120 because the wide width portion 120b is formed. Therefore, even when the groove portions 120 are formed in place of the groove portions 20 in the semiconductor wafer 1, the reliability of electrical connection of the laminated chip package can be enhanced.

Further, groove portions 121 as illustrated in FIG. 35(B) may be formed in place of the groove portions 20 in the above-described semiconductor wafer 1. The groove portion 121 is different from the groove portion 20 in that it has an inclined edge portion 20f. The inclined edge portion 20f is formed at the inlet port of the wide width portion 20b. The inclined edge portion 20f is an inclined surface gradually inclined downward from the outside to the inside.

The above-described semiconductor wafer 1 has a structure in which the inlet port 20d is angular because the inclined edge portion 20f is not formed at the groove portions 20 and 21 (see FIG. 6). In contrast, in the groove portion 121, the inclined edge portion 20f is formed so that a liquid resin easily flows from the outside of the groove portion 20 to the inside along the inclined edge portion 20f. Therefore, by forming the groove portion 121, the resin enters more easily.

Though the above embodiments describe a device wafer in which a plurality of devices are created by way of example of the semiconductor substrate, the present invention is also applicable to a semiconductor substrate having no semiconductor device. Further, though the wiring electrodes 15 and 16 have a protruding shape, the present invention is also applicable to a semiconductor substrate including wiring electrodes not having the protruding structure. Furthermore, instead of the terminal portions extended from the device region 10 to the inside of the groove portion like the extended terminal portions 15a and 16a, terminal portions structured to be located straddling the groove portion in two adjacent device regions 10 may be formed.

What is claimed is:

1. A semiconductor substrate having a plurality of groove portions formed along scribe lines, comprising:
   a unit region in contact with at least any one of the plurality of groove portions;
   a wiring electrode with a portion thereof arranged within the unit region; and
   an insulating layer formed by filling the plurality of groove portions with a resin with no space, wherein
      the plurality of groove portions have a wide-port structure in which a wide width portion wider in width than a groove lower portion including a bottom portion is formed at an inlet port thereof;
      the wide width portions are formed in the entire length direction of the inlet ports thereof;
      the insulating layer has a double-layer structure in which a lower insulating layer formed inside of the groove lower portion and an upper insulating layer formed inside of the wide width portion are laminated; and
      the lower insulating layer is formed using a low-viscosity resin lower in viscosity than the resin forming the upper insulating layer.

2. The semiconductor substrate according to claim 1, wherein
   the unit region is formed as a device region having a semiconductor device,
   the semiconductor substrate further comprises a surface insulating layer formed to cover the device region and constituting a surface layer of the semiconductor substrate, and
   the surface insulating layer is formed using the same resin as the resin of the upper insulating layer in one body without joint.

3. The semiconductor substrate according to claim 1,
   wherein the wiring electrode has an extended terminal portion extended from the unit region to an inside of the groove portion.

4. The semiconductor substrate according to claim 2,
   wherein the wiring electrode has an extended terminal portion extended from the device region to an inside of the groove portion, and is formed in a protruding shape rising above a surface of the surface insulating layer.

5. The semiconductor substrate according to claim 4, wherein the wiring electrode has a cross side surface projecting outward from the surface of the surface insulating layer and crossing with the surface of the surface insulating layer, a top end face projecting outward from the surface of the surface insulating layer and disposed along the surface of the surface insulating layer, and an embedded portion embedded inward from the surface of the surface insulating layer.

6. The semiconductor substrate according to claim 4, further comprising:
   a connecting pad connected to the semiconductor device; and
   a protecting insulating layer having a connecting hole formed at a position for forming the connecting pad, the protecting insulating layer being disposed under the surface insulating layer and formed to cover the device region,
   wherein the wiring electrode has an electrode pad having an expanded height from a side outer than the surface of the surface insulating layer to the connecting pad.

7. A method of manufacturing a semiconductor substrate, comprising:
   for an unprocessed substrate having a semiconductor device formed therein,
   a first groove portion forming step of forming, along scribe lines, a plurality of first groove portions having a first width and a first depth;
   a second groove portion forming step of forming, at inlet ports of the plurality of first groove portions, second groove portions having a second width wider than the first width and a second depth shallower than the first depth;
   an insulating layer forming step of applying a resin to a surface on a side where the first groove portions and the second groove portions are formed, to form an insulating layer inside the first groove portions and the second groove portions,
      wherein, prior to the application of the resin, a low-viscosity resin lower in viscosity than the resin is applied to the surface to form a lower insulating layer inside the first groove portions; and
   a wiring electrode forming step of forming a wiring electrode to be connected to the semiconductor device after the formation of the insulating layer.

8. The method of manufacturing a semiconductor substrate according to claim 7,
   wherein in the insulating layer forming step, a surface insulating layer is formed using the resin on the surface on the side where the first groove portions and the second groove portions are formed, and
   wherein in the wiring electrode forming step, the wiring electrode is formed in a protruding shape rising above a surface of the surface insulating layer.

9. The method of manufacturing a semiconductor substrate according to claim 8,
   wherein in the wiring electrode forming step, an extended terminal portion extended from a device region in contact with at least any one of the plurality of first groove portions to the first groove portion is formed in a protruding shape rising above the surface of the surface insulating layer.

* * * * *